United States Patent [19]

Ogura et al.

[11] Patent Number: 5,287,388
[45] Date of Patent: Feb. 15, 1994

[54] FREQUENCY OFFSET REMOVAL METHOD AND APPARATUS

[75] Inventors: Koji Ogura; Mutsumu Serizawa, both of Tokyo, Japan

[73] Assignee: Kabushiki Kaisha Toshiba, Kawasaki, Japan

[21] Appl. No.: 720,694

[22] Filed: Jun. 25, 1991

[51] Int. Cl.⁵ .......................................... H04L 27/06
[52] U.S. Cl. ................................... 375/97; 455/192.2
[58] Field of Search ............... 375/97, 121; 455/192.2, 455/196.1, 164.1; 329/318

[56] References Cited

U.S. PATENT DOCUMENTS

| | | | |
|---|---|---|---|
| 4,348,641 | 9/1982 | Scott et al. | 329/50 |
| 4,498,191 | 2/1985 | Rodgers | 455/192.2 X |
| 4,531,089 | 7/1989 | Ishizuka et al. | 364/483 X |
| 4,651,104 | 3/1987 | Miyo | 455/192 X |
| 4,696,056 | 9/1987 | Morita | 375/97 X |
| 4,764,730 | 8/1988 | Miyo et al. | 329/50 |
| 4,916,405 | 4/1990 | Keate et al. | 375/97 X |
| 5,052,024 | 9/1991 | Moran, III et al. | 370/30 X |
| 5,107,522 | 4/1992 | Kitayama et al. | 375/97 |
| 5,113,416 | 5/1992 | Lindell | 375/97 |
| 5,159,282 | 10/1992 | Serizawa et al. | 329/316 |

FOREIGN PATENT DOCUMENTS 63-310919 12/1988 Japan .

OTHER PUBLICATIONS

Transaction of IEICE of Japan; Author, K. Okanoue et al.; A New MLSE Receiver With Carrier Frequency Offset Compensater for TDMA Mobile Radio; Trans. IEICE. vol.-J-73-B-II, No. 11, pp. 736-744.

*Primary Examiner*—Curtis Kuntz
*Assistant Examiner*—Bryan E. Webster
*Attorney, Agent, or Firm*—Oblon, Spivak, McClelland, Maier & Neustadt

[57] ABSTRACT

A frequency-offset removal apparatus comprises a receiving section for receiving a signal including a training sequence, a local oscillator for generating an oscillating signal to synchronize with the received signal, a frequency sweeping section for sweeping the frequency of the oscillating signal through a specific frequency which is identical with the carrier frequency of the received signal, a frequency shifting section for shifting the carrier frequency of the received signal by each oscillating signal, a selector for selecting one specific frequency-shifted-signal having the nearest frequency to the specific frequency from the frequency-shifted-signals generated in the frequency shifting section, and a frequency adjusting circuit for adjusting the frequency of the oscillating signal to generate a specific oscillating signal which produces the specific frequency-shifted-signal after shifting by the received signal.

13 Claims, 10 Drawing Sheets

FREQUENCY OFFSET REMOVAL METHOD AND APPARATUS

BACKGROUND OF THE INVENTION

1. Field of the invention

The present invention relates to a frequency-offset removal method and apparatus in which frequency offset is reliably removed even if a burst signal is received.

2. Description of Background

Generally, in radio communication, when high frequency radio waves are received by a receiver in which the received signals are demodulated to base-band signals, an oscillating frequency provided from a local oscillator in the receiver must be adjusted to a specific frequency which is identical with the carrier frequency of the received signals.

Therefore, the frequency of the local oscillator is adjusted by utilizing a phase lock loop (PLL) circuit or an auto frecuency control (AFC) circuit so that the frequency is synchronized with the received signals in a conventional receiver. In detail, the difference between the frequency from the oscillator and the carrier frequency of the received signals is detected as phase difference (in case of PLL), then the oscillating frequency of the local oscillator is controlled corresponding to the level of the phase difference so that the local oscillator can provide the oscillating signal identical with the carrier frequency of the received signal.

The above conventional method can be applied to digital communication.

However, when the received signal is formed from a burst signal occuring in the communication of the time division multiple access (TDMA), the burst signal is too short to allow adjustment of the frequency of the oscillator. Therefore, it is difficult for the conventional oscillator to adjust the oscillating frequency by utilizing the PLL circuit. In particular, when the received signal is distorted by multipath fading in the communication with a mobile station, it is substantially impossible to adjust the oscillating frequency by using the PLL circuit. Also, to synchronize the above signals in an extremely short period, which is required when a hand-off occurs, is impossible in the mobile communication.

As mentioned above, in the conventional method for adjusting the oscillating frequency by utilizing the PLL circuit, when one burst training signal or preamble signal is too short in such digital mobile communication utilizing the TDMA method, the removal of the frequency offset is very difficult. In particular, when the hand-off operation is carried out in the TDMA mobile communication method, the synchronous adjustment is required at a high speed. Therefore, a frequency-offset removal apparatus which can be applied in the TDMA mobile communication method is required.

SUMMARY OF THE INVENTION

It is an object of the present invention to provide a frequency-offset removal apparatus in which the removal of the frequency-offset is reliably completed when a burst signal is received.

The object is achieved by the provision of a frequency-offset removal apparatus, comprising:

a receiving section for receiving a signal including a training sequence;

a local oscillator for generating an oscillating signal to synchronize with the signal received in the receiving section;

a frequency sweeping section for sweeping the frequency of the oscillating signal generated in the local oscillator through a specific frequency which is identical with the carrier frequency of the received signal;

a frequency shifting section for shifting the carrier frequency of the received signal by each oscillating signal generated in the local oscillator, each oscillating signal being swept in the frequency sweeping section;

a selecting section for selecting one specific frequency-shifted-signal having the nearest frequency to the specific frequency from the frequency-shifted-signals generated in the frequency shifting section; and a frequency adjusting section for adjusting the frequency of the oscillating signal generated in the local oscillator to generate a specific oscillating signal which produces the specific frequency-shifted-signal after shifting by the received signal, the specific oscillating signal being shifted in the frequency shifting section by the received signal to produce a signal having the frequency-offset removed before sending the signal to a demodulator.

It is preferable that the selecting section include:

a matched filter for producing a matched signal of which the strength is changed according to the value of the frequency offset of the frequency-shifted-signal generated in the frequency shifting section and becomes the largest value when the value of the frequency offset is zero, the matched signal being provided for each oscillating signal;

an electric power calculator for calculating the electric power of each matched signal generated in the matched filter; and an electric power comparator and memory for comparing the electric power of each matched signal and storing the maximum value of the electric power and the frequency of the corresponding oscillating signal, the stored frequency is equivalent to the nearest frequency to the specific frequency.

Before describing the above configuration, the matched filter is generally provided with tap coefficients in advance. The tap coefficients are equal to conjugate complex numbers of training signals. At this time, when the training signal is provided to the matched filter, the matched filter provides a matched signal with a high value. When the frequency offset is zero, the matched filter provides the maximum value. In other words, when the carrier frequency of the received signal is identical with the oscillating frequency, the electric power of the matched signal reaches its greatest value. Also, the electric power value of the matched signal is almost proportional to the absolute value of the frequency offset. Therefore, the value of the frequency offset can be detected by calculating the electric power value of the matched signal when one of the oscillating signals is provided to the frequency shifting section.

In the above configuration, the local oscillator generates many types of oscillating signals which are generated by sweeping the oscillating frequency. Each oscillating signal is multiplied by the received signal, and the frequency-shifted-signal is provided to the matched filter for generating the matched signal. Then, the electric power value of the matched signal is calculated for detecting the value of the frequency offset of the frequency-shifted-signal.

The calculation of the electric power value is carried out for each type of oscillating signal.

Therefore, when the oscillating frequency of the local oscillator is swept step by step for each burst signal received in the received section, the nearest frequency to the specific frequency in which the frequency offset between the oscillating signal and the received signal becomes zero is reliably found after several steps.

Thereafter, the above oscillating signal with the nearest frequency to the specific frequency is sent to the shifting section after the sweeping operation to produce a frequency-shifted-signal, which has the frequency-offset, before sending to a demodulator.

Accordingly, even if a burst signal is received, the removal of the frequency offset removed can be reliably completed by sending the nearest frequency to the specific frequency to the frequency shifting section.

The above apparatus is also suitable for roughly removing the frequency-offset.

The object is achieved by the provision of a frequency-offset removal apparatus, comprising:

a receiving section for receiving a signal including training sequence;

a local oscillator for generating an oscillating signal to synchronize with the signal received in the receiving section;

a frequency shifting section for shifting the carrier frequency of the received signal by a prescribed oscillating signal generated in the local oscillator;

a memory section for storing the frequency-shifted-signal provided from the frequency shifting section;

a frequency-offset detecting section for detecting the value of the frequency offset of the frequency-shifted-signal stored in the memory section; and a frequency-offset removal section for removing the frequency offset of the frequency-shifted-signal stored in the memory section after receiving frequency-offset information of the frequency-shifted-signal from the frequency-offset detecting section.

In the above configuration, the signal received in the receiving section is shifted in frequency by the oscillating signal generated in the local oscillator. Then, the frequency-shifted-signal is stored in the memory section to detect the value of the frequency offset thereof in the frequency-offset detecting section. The frequency-shifted-signal stored in the memory section is read out to the frequency-offset detecting section many times until the value of the frequency offset thereof is detected.

After detecting the value of the frequency offset of the frequency-shifted-signal, the frequency offset in the frequency-shifted-signal is removed in the frequency-offset removal section.

Accordingly, the frequency offset can be removed by receiving only one burst signal in the receiving section. That is, the frequency offset can be rapidly removed regardless of the frequency of arrival of the burst signals at the receiving section.

It is preferable that the frequency-offset detecting section include:

a second local oscillator for generating an oscillating signal, the frequency of the oscillating signal being swept through a specific frequency;

a second frequency shifting section for re-shifting the frequency-shifted-signal stored in the memory by each oscillating signal generated in the second local oscillator, the signal generated in the second frequency shifting section having no frequency offset when the signal is shifted by the specific frequency of the oscillating signal;

a matched filter for providing a matched signal of which the strength is changed almost proportional to the absolute value of the frequency offset of the frequency-shifted-signal and becomes the largest value when the value of the frequency offset is zero, the matched signal being provided for each oscillating signal;

an electric power calculator/selector for calculating the electric power of each matched signal generated in the matched filter and selecting the maximum electric power; and a control section for controlling the frequency of the oscillating signal generated in the second local oscillator and providing a specific oscillating frequency to the frequency-offset removal section, the specific oscillating frequency corresponding to the matched signal with the maximum electric power selected in the selector.

In the above configuration, the frequency-shifted-signal stored in the memory section is read out to the matched filter after being shifted the frequency thereof by the oscillating signal many times to select the nearest frequency to the specific frequency in the selector.

Accordingly, the value of the frequency offset can be reliably detected by using only one frequency-shifted-signal stored in the memory section.

It is also preferable that the frequency-offset removal section include:

a third local oscillator for generating the frequency of the specific oscillating signal provided from the frequency-offset detecting section; and a third frequency shifter for shifting the frequency-shifted-signal stored in the memory by the specific oscillating signal generated in the third local oscillator to produce a signal which has no frequency-offset.

In the above configuration, the frequency offset is removed from the frequency-shifted-signal stored in the memory section after receiving the specific oscillating frequency detected in the frequency-offset detecting section.

Accordingly, the frequency offset can be reliably removed by using only one frequency-shifted-signal stored in the memory section.

The object is also achieved by the provision of a frequency-offset removal apparatus, comprising:

a receiving section for receiving a signal including training sequence;

a first local oscillator for generating a first oscillating signal to synchronize with the signal received in the receiving section;

a first shifter for shifting the signal received in the receiving section by the oscillating signal generated in the first local oscillator;

a plurality of second shifters for re-shifting the signal shifted the frequency thereof in the first shifter by each second oscillating signal generated in each second local oscillator, a group of frequencies of the second oscillating signals ranging from high frequency to low frequency through a specific frequency by which the frequency-offset between the second oscillating signal and the carrier frequency of the signal received in the receiving section becomes zero;

a plurality of matched filters for producing matched signals from the frequency re-shifted signals, the strength of each matched signal being changed according to the value of the frequency offset of the frequency-shifted-signal generated in the second shifter and reaching the largest value when the value of the frequency offset is zero;

a plurality of electric power calculators for calculating each electric power value of the matched signal generated in the matched filter; and a selecting section for selecting one frequency reshifted signal with the maximum electric power, the frequency-reshifted-signal being sent to a demodulator.

In the above configuration, the signal received in the receiving section is shifted the frequency thereof by the first oscillating signal and sent to the plurality of second shifters to be re-shifted the frequency thereof by each second oscillating signal simultaneously. Each frequency of one second oscillating signal differs from the frequencies of the other second oscillating signals.

Accordingly, in the present invention, the nearest frequency to the specific frequency in which a frequency offset between the second oscillating signal and the signal shifted the frequency thereof in the first shifter becomes zero can be immediately detected, and one frequency re-shifted signal corresponding to the nearest frequency can be selected in the selecting section to be demodulated in the modulator.

The object is also achieved by the provision of a frequency-offset removal apparatus, comprising:

a receiving section for receiving a signal including training sequence;

a local oscillator for generating an oscillating signal to synchronize with the signal received in the receiving section;

a frequency shifting section for shifting the carrier frequency of the received signal by a prescribed oscillating signal generated in the local oscillator;

a memory section for storing the frequency-shifted-signal provided from the frequency shifting section;

a second local oscillator for generating a variable oscillating signal;

a frequency re-shifter for shifting the signal stored in the memory section and providing first and second signals in turn, the first signal being shifted the frequency thereof by an amount of $+\Delta fd$ and the second signal being shifted the frequency thereof by an amount of $-\Delta fd$;

a comparing/calculating section for calculating the difference between first and second matched filter output power, the first matched filter output power being obtained by feeding the first signal into a matched filter before calculating the output power and the second matched filter output power being obtained by feeding the second signal into the matched filter before calculating the output power; and a frequency adjusting section for adjusting the frequency of the oscillating signal generated in the second local oscillator according to the calculated difference obtained in the calculating section to produce a specific frequency re-shifted signal which has no frequency offset, the specific frequency re-shifted signal being sent to a demodulator.

In the above configuration, the electric power of the first and second signals is always calculated to compare the difference. The difference in electric power is small when the frequency offset is small, while the difference in electric power is large when the frequency offset is large.

Accordingly, the oscillating signal can be adjusted with high accuracy.

The object is also achieved by the provision of a frequency-offset removal apparatus, comprising:

a receiving section for receiving a signal formed in a prescribed pattern;

a local oscillator for generating an oscillating signal to synchronize with the signal received in the receiving section;

a frequency shifting section for shifting the carrier frequency of the received signal by a prescribed oscillating signal generated in the local oscillator;

a pair of shifters for re-shifting the frequency-shifted-signal generated in the frequency shifting section to produce first and second signals respectively, the first signal having the frequency offset $\Delta fm + \Delta fd$ and the second signal having the frequency offset $\Delta fm - \Delta fd$;

a comparing/calculating section for calculating the difference between first and second matched filter output power, the first matched filter output power being obtained by feeding the first signal into a matched filter before calculating the output power and the second matched filter output power being obtained by feeding the second signal into the matched filter before calculating the output power; and a frequency adjusting section for adjusting the frequency of the oscillating signal generated in the local oscillator to produce a specific frequency re-shifted signal which has no frequency offset, the specific frequency re-shifted signal being sent to a demodulator.

It is also preferable that the comparing/calculating section include:

a pair of matched filters for providing first and second matched signals respectively, each matched signal containing a main impulse and subsequent smaller impulses and the strength of the signal being changed according to the value of the frequency offset of the first or second signal generated in each shifter and reaching the largest value when the value of the frequency offset is zero;

a pair of electric power calculators for calculating the electric power of each matched signal generated in the matched filter;

an electric power subtractor for calculating the difference in the electric power values of the matched signals, the difference of the electric power values being almost proportional to the frequency offset $\Delta fm$; and a control section for providing the difference in the electric power values of the matched signals calculated in the subtracter to the frequency adjusting section when the difference in the electric power between the main impulses is calculated in the subtracter.

In the above configuration, the first and second signals are simultaneously re-shifted the frequency thereof, and filtered. Thereafter, each electric power of the signals is calculated. The received signal is distorted by multipath fading in the communication so that the matched filter has many impulses for one frequency re-shifted signal. In this embodiment, each electric power value for the main impulse is calculated and the electric power difference in the main impulses is sent to the frequency adjusting section.

In other words, each multipath component is separated at the output of the matched filter and the frequency offset can be detected without being disturbed by other multipath components.

Accordingly, even if a distorted signal is received, the frequency offset can be reliably removed.

DESCRIPTION OF THE SPECIFIC EMBODIMENTS

Preferred embodiments are described with reference to FIG. 1 to FIG. 14.

Figure 1:
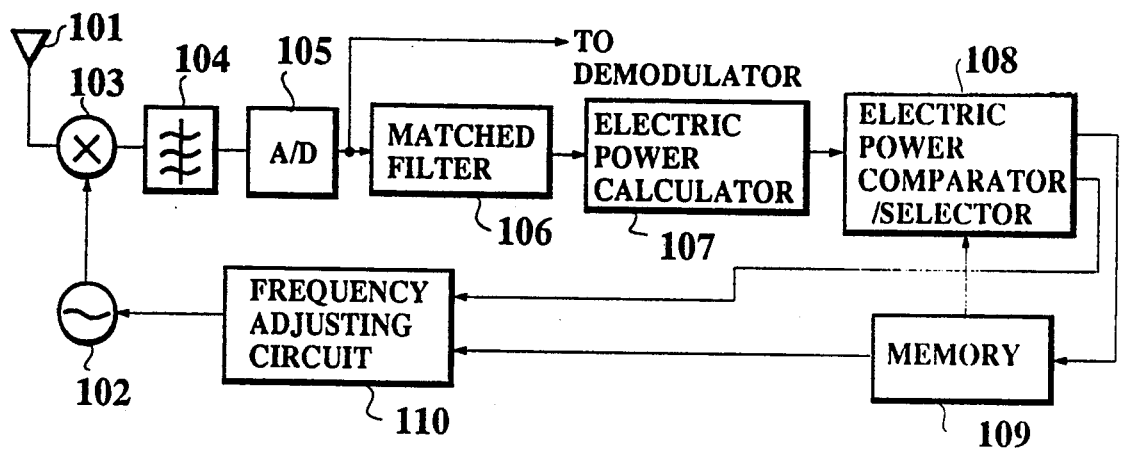
FIG. 1 is a block diagram of a frequency-offset removal apparatus according to the present invention, showing a first embodiment.

FIG. 1 is a block diagram of a frequency-offset removal apparatus according to the present invention, showing a first embodiment.

As shown in FIG. 1, the frequency-offset removal apparatus according to the present invention comprises:

a receiving terminal 101 for receiving a signal which includes a specific pattern such as M series or Gold series;

a local oscillator 102 for generating an oscillating signal;

a frequency adjusting circuit 110 for adjusting the frequency of the oscillating signal generated in the local oscillator 102 under the control of a prescribed procedure;

a complex shifter 103 for shifting the signal received in the receiving terminal 101 by the oscillating signal generated in the local oscillator 102 and providing a base-band signal;

a low-pass filter 104 for filtering the base-band signal provided from the complex shifter 103 and passing a low frequency signal;

an analog-digital converter 105 for converting the low frequency signal to a digital converted signal;

a matched filter 106 of a transversal type for producing a matched signal from the digital converted signal generated in the analog-digital converter 105, the matched signal having a specific electric power value proportional to the difference between the carrier frequency of the received signal and the frequency of the oscillating signal and having the maximum electric power value when the frequencies of two signals are identical;

an electric power calculator 107 for calculating the electric power of the matched signal generated in the matched filter 106, the calculating operation being carried out for each oscillating signal of which the frequency is adjusted in the frequency adjusting circuit 110;

an electric power comparator/selector 108 for comparing the electric power of the matched signal calculated in the electric power calculator 107 with the greatest electric power value in the previous matched signals and selecting the matched signal which has the greater value of the electric power, the comparator/selector 108 transmitting the results of the comparing operation to the frequency adjusting circuit 110 to cause the circuit 110 to adjust the frequency of the oscillating signal; and a memory 109 for storing the frequency and the greatest electric power value of the matched signal selected in the electric power comparator/selector 108 and providing the electric power value of the matched signal to the electric power comparator/selector 108 to compare with a new electric power value of a new matched signal calculated in the electric power calculator 107, the memory 109 providing the frequency of the matched signal as the specific signal having the greatest electric power value to the electric power comparator/selector 108 after completing the adjusting operation in the frequency adjusting circuit 110 and the selecting operation in the comparator/selector 108.

The signal received in the receiving terminal 101 is, for example, a time division multiplex (TDM) signal or a TDMA signal as shown in FIGS. 2a and 2b respectively. The above signal having a specific pattern is added to the received signal as a sync signal, a training signal, or preamble signal.

The matched filter 106 of a transversal type is in advance provided with tap coefficients which are equal to conjugate complex numbers of training signals. At this time, when the training signal is provided to the matched filter, the most suitable timing occurs because the sampling speed is faster than the transmitting speed. Therefore, when the carrier frequency of the received signal is identical with the frequency of the oscillating signal, that is, the frequency offset is zero, the matched filter provides a specific signal having the greatest electric power value. Accordingly, by sweeping the frequency of the oscillating signal, a main robe can be detected as follows.

When the modulating method is the binary phase shift keying (BPSK) and the frequency offset between the carrier frequency of the received signal and the frequency of the oscillating signal is $\Delta\omega$, a digital converted signal provided to the matched filter 106 is determined as follows.

$$X(t) = A \exp j(\Delta\omega + \theta + (\pi/2) \cdot a(t))$$

a(t): +1 or −1 (M series data).

Figure 3:
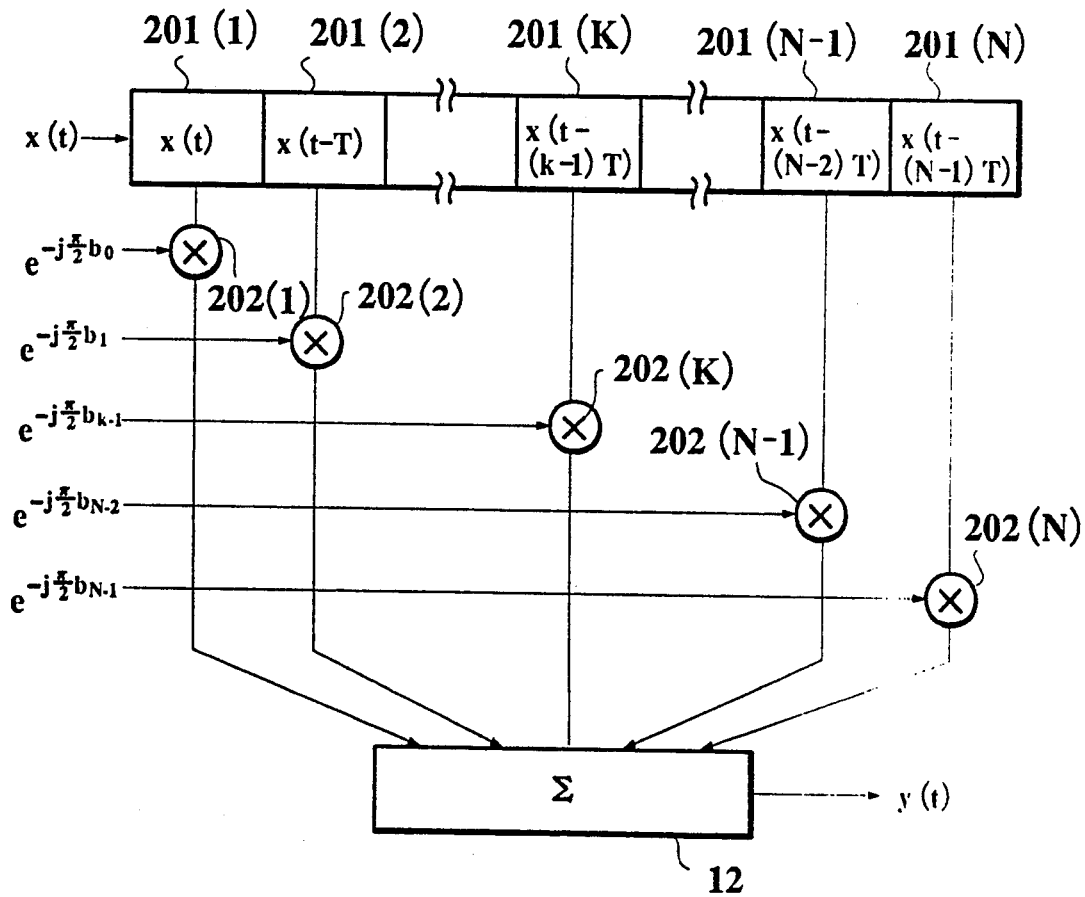
FIG. 3 is a block diagram of a matched filter shown in FIG. 1.
Figure 2:
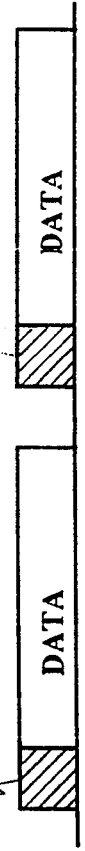
FIG. 2a shows TDM signals received in a receiving terminal.
FIG. 2b shows TDMA signals received in a receiving terminal.
Figure 2:
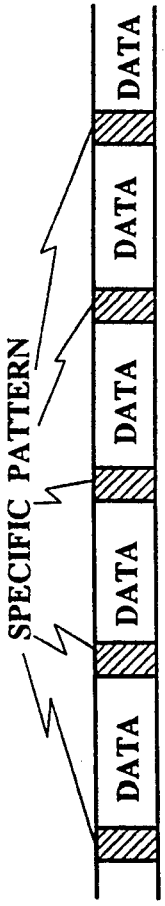

The matched filter 106 is modeled as shown in FIG. 3, and a tap coefficient of the K step in the matched filter 106 is determined as follows.

$$x(t^{-1}(k-1)T) = A \exp(j(\Delta\omega(t-(k-1)T) + \theta + (\pi/2)\cdot a(t-(k-1)T)).$$

A yield y(t) of the matched filter 106 is found as follows.

$$\begin{aligned} y(t) &= \Sigma x(t - kT) \cdot \exp(-j \cdot \pi/2 \cdot b_k) \\ &= A \cdot \Sigma \exp(j(\Delta\omega(t - kT) + \theta + (\pi/2) \cdot a(t - kT)) \cdot \\ & \quad \exp(-j \cdot \pi/2 \cdot b_k) \\ &= A \cdot \Sigma \exp(j(\pi/2 \cdot a(t - kT))) \cdot \exp(-j \cdot \pi/2 \cdot b_k) \cdot \\ & \quad \exp(j(\Delta\omega(t - kT) + \theta) \end{aligned}$$

When an input M series a(t−kT) is identical with $b_k$, $$\exp(j(\pi/2 \cdot a(t-kT))) \cdot \exp(-j \cdot \pi/2 \cdot b_k) = 1.$$

Therefore, the yield y(t) is found as follows.

$$\begin{aligned} y(t) &= A \cdot \Sigma \exp(j(\Delta\omega(t - kT) + \theta)) \\ &= A \cdot (\Sigma \exp(j(\Delta\omega(t - kT)\theta)) \cdot \exp(j\theta)) \\ &= A \cdot \exp(j \cdot (N - 1)/2 \cdot \Delta\omega T) \cdot \\ & \quad \sin(N \cdot \Delta\omega/2 \cdot T)/\sin(\Delta\omega/2 \cdot T) \cdot \\ & \quad \exp(j\Delta\omega t) \cdot \exp(j\theta) \end{aligned}$$

The electric power W of the matched signal provided from the matched filter 106 is found as follows.

$$W = y(t) \cdot y^*(t) = A^2 \sin^2(N \cdot \Delta\omega/2 \cdot T)/\sin^2(\Delta\omega/2 \cdot T),$$

Figure 4:
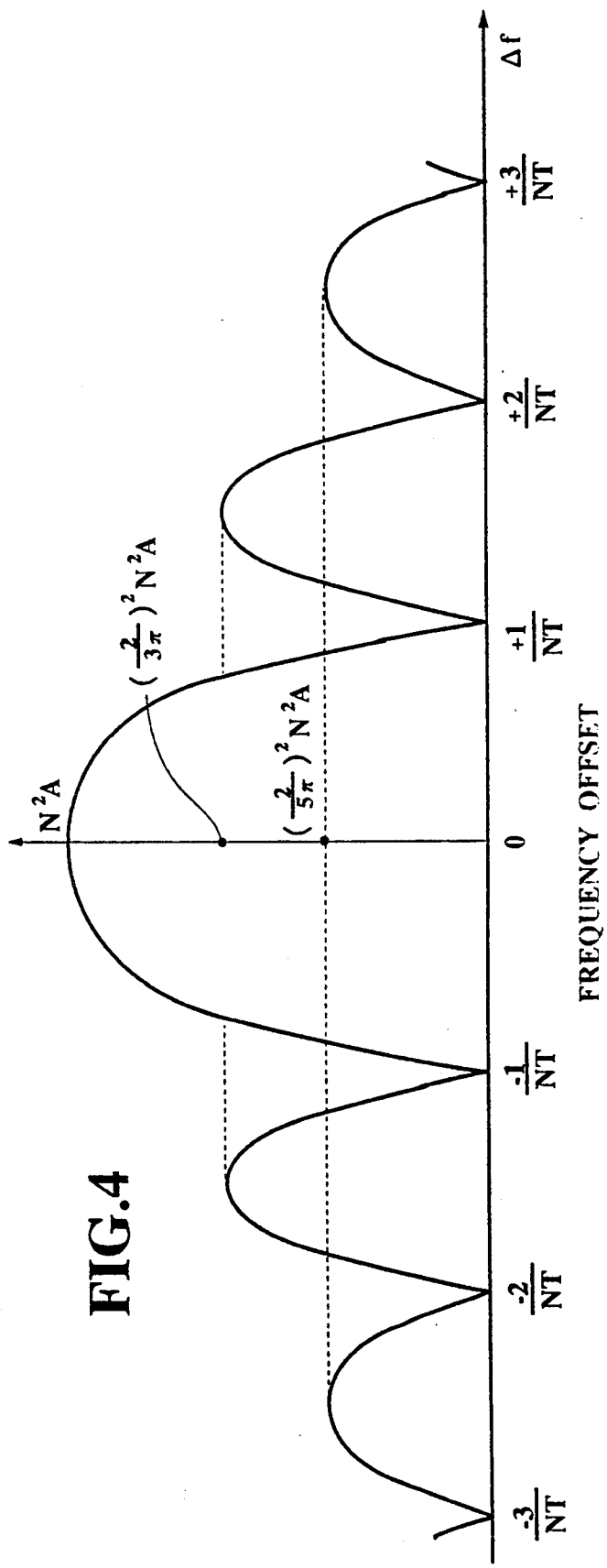
FIG. 4 shows the relation between an electric power of a matched signal and frequency offset.

Therefore, the electric power W of the matched signal is changed according to the frequency offset Δf as shown in FIG. 4.

Accordingly, when the frequency offset Δf is swept by the interval Δf<2/NT, the main robe can be reliably detected.

Figure 5:
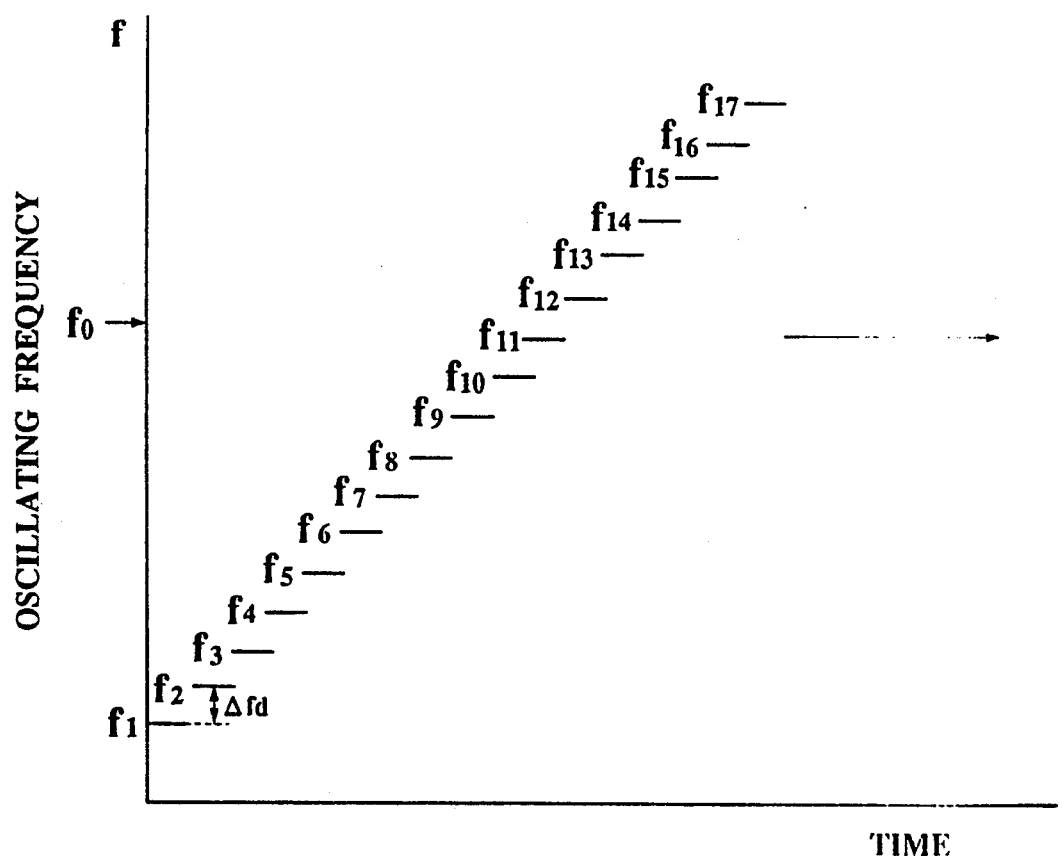
FIG. 5 shows oscillating frequencies being swept in a local oscillator under the control of the frequency adjusting circuit.

In the above configuration, when the carrier frequency of the received signal is detected, the oscillating signal generated in the local oscillator 102 is swept under the control of the frequency adjusting circuit 110 as shown in FIG. 5.

The strength of the received signal containing M series is changed to an impulse during autocorrelation and each bit of the received signal is coincident. On the other hand, when autocorrelation is not performed and each bit is not coincident, the strength of the received signal is changed to near zero. Therefore, when each bit between the tap coefficients of the matched filter 106 and the digital converted signal generated in the analog-digital converter 105 is coincident, the resultant electric power value is provided from the electric power calculator 107. The output of the electric power calculator 107 becomes a maximum when the frequency offset is zero, therefore a specific frequency at which the output of the electric power calculator 107 becomes maximum is detected while changing the oscillating frequency of the local oscillator 102 gradually. The resultant frequency is identical with the carrier frequency of the received signal when the output of the electric power calculator 107 is maximum.

In detail, the oscillating frequency is swept from the possible lowest frequency to the possible highest frequency at a minute interval Δfd of the frequency. That is, when the local oscillator 102 oscillates at the lowest frequency f1 in which the frequency offset occurs, the resultant electric power value is calculated in the electric power calculator 107. Then, the local oscillator 102 oscillates at a second frequency f2 at the interval Δfd so that the resultant electric power is calculated again in the electric power calculator 107. After calculating, the above two kinds of electric power are compared and the oscillating frequency with the larger value is selected in the comparator/selector 108 and the selected frequency and electric power are stored in the memory 109.

Thereafter, a third oscillating frequency f3 at interval Δfd is provided and the electric power value is calculated so that the frequency f3 (f3=f2+Δfd) is compared with the stored frequency f1 or f2 to select the frequency with the larger value electric power. In the same manner, following oscillating frequencies f4, f5, - - -, and f16 are provided in the local oscillator 102 and the highest oscillating frequency f17 is finally provided. Therefore, the highest electric power calculated in the calculator 107 and the corresponding oscillating frequency are always stored in the memory 109 during the sweeping operation.

When the specific oscillating frequency in which the maximum electric power is generated is detected and determined, that frequency is regarded as the carrier frequency of the received signal and transmitted to the frequency adjusting circuit 110 to generate the oscillating signal with a frequency identical to the specific oscillating frequency in the local oscillator 102. Then, the digital converted signal converted in the analog-digital converter 105 is transmitted to a demodullator because the frequency offset between the carrier frequency of the received signal and the oscillating frequency has been removed.

Accordingly, in the present invention, many kinds of digital converted signals obtained by sweeping the oscillating frequency of the local oscillator 102 are provided to the matched filter 106 to detect the value of the frequency offset, and then the frequency offset is removed. Therefore, the specific frequency at which the frequency offset is removed can be reliably determined after carrying out the prescribed number of steps by sweeping the oscillating frequency of the local oscillator 102 step by step for each burst signal. That is, even if the burst signal is received, the frequency offset can be reliably removed.

Figure 6:
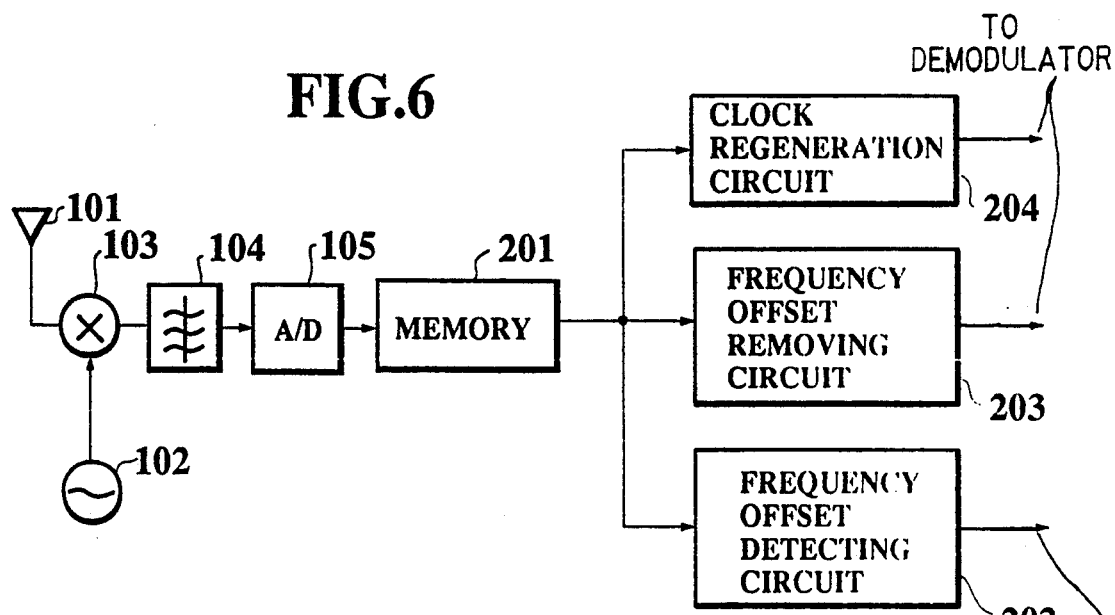
FIG. 6 is a block diagram of another frequency-offset removal apparatus according to the present invention, showing a second embodiment.

Next, a second embodiment is described according to the present invention with reference to FIG. 6.

FIG. 6 is a block diagram of another frequency-offset removal apparatus according to the present invention.

As shown in FIG. 6, the frequency-offset removal apparatus comprises:

the receiving terminal 101;
the local oscillator 102;
the complex shifter 103;
the low-pass filter 104;
the analog-digital converter 105;
a memory 201 for storing a digital converted signal converted in the converter 105;
a frequency offset detecting circuit 202 for detecting the value of the frequency offset between the carrier frequency of the received signal and the oscillating frequency generated in the local oscillator 102 after reading out the digital converted signal stored in the memory 201, the circuit 202 containing the matched filter as shown in FIG. 1 or the PLL circuit;
a frequency offset removing circuit 203 for removing the frequency offset of the digital converted signal stored in the memory 201 after detecting the value of the frequency offset in the frequency offset detecting circuit 202, the circuit 203 providing the digital converted signal to a demodulator after removing the frequency offset of the signal; and a clock regeneration circuit 204 for regenerating the clock signal after detecting the most suitable clock position for the digital converted signal stored in the memory 201, the clock signal regenerated in the circuit 204 being utilized in the demodulator for decoding the digital converted signal from which the frequency offset has been removed in the frequency offset removing circuit 203.

In the above configuration, as described in the first embodiment in FIG. 1, the signal received in the receiving terminal 101 is transformed to an intermediate frequency (IF) signal or a base band signal in the complex shifter 103 by shifting by the oscillating signal generated in the local oscillator 102. The transformed signal is then filtered in the low-pass filter 104 before being changed to a digital signal in the analog-digital converter 105 and stored in the memory 201.

In the complex shifter 103, the frequency offset occurs in the IF signal or the base band signal because the carrier frequency of the received signal is not identical to the oscillating signal generated in the local oscillator 102.

In the frequency offset detecting circuit 202, the digital converted signal stored in the memory 201 is read out from the memory 201 many times until the value of the frequency offset of the converted signal is detected with prescribed precision.

In the frequency offset removing circuit 203, the digital converted signal is read out from the memory 201 and the frequency offset of the signal is removed.

Accordingly, the received signal is temporarily stored in the memory 201 and the frequency offset of the stored signal can be reliably removed because the stored signal can be read out to the frequency offset detecting circuit 202 many times.

In particular, in the TDMA communication, the frequency offset can be removed during the reception of one burst by using only one burst signal. That is, in the second embodiment, the wasted time for waiting for the a next burst signal which is required in the first embodiment, as shown in FIG. 1, is not needed.

In detail, many burst signals identical in number with the number of sweeping operations are needed as the training signals in the first embodiment because the frequency offset is detected after receiving the signal in real time in the receiving terminal 101. That is, in the first embodiment, it takes a long time to complete the detection of the value of the frequency offset and remove the offset so that the output signal to the demodulator has not been removed the frequency offset until the detection and removal is completed. However, in the second embodiment, the frequency offset can be promptly removed during only a single burst signal so that the following burst signals can be reliably demodulated.

Next, a third embodiment slightly different from the second embodiment as shown in FIG. 6 is described with reference to FIG. 7.

Figure 7:
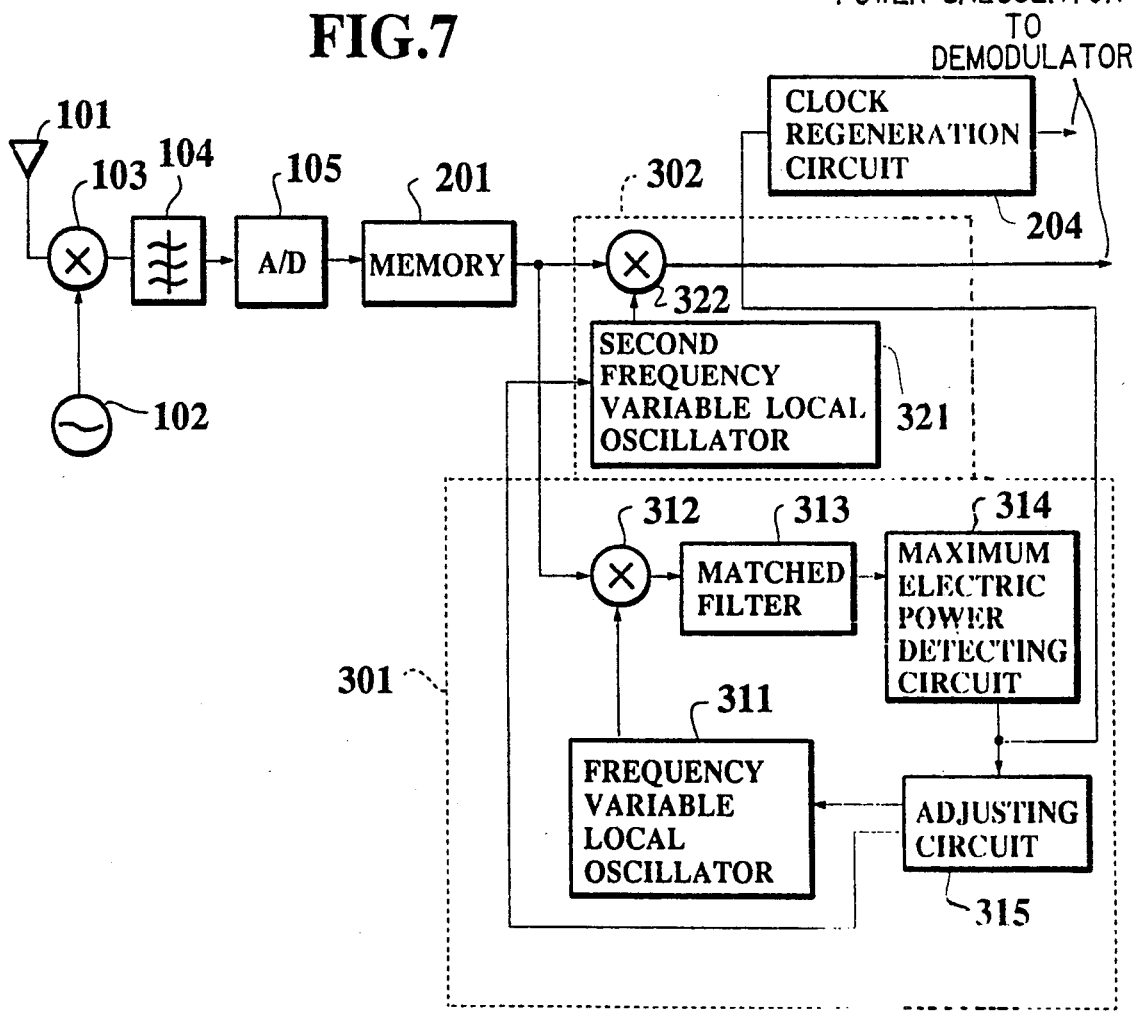
FIG. 7 is a block diagram of another frequency-offset removal apparatus according to the present invention, showing a third embodiment.

FIG. 7 is a block diagram of another frequency-offset removal apparatus according to the present invention.

As shown in FIG. 7, the frequency-offset removal apparatus comprises:
the receiving terminal 101;
the local oscillator 102;
the complex shifter 103;
the low-pass filter 104;
the analog-digital converter 105;
the memory 201;
a frequency offset detecting section 301 for detecting the value of the frequency offset occuring in the complex shifter 103;
a frequency offset removing section 302 for removing the frequency offset detected in the detecting section 301; and
the clock regeneration circuit 204.

The frequency offset detecting section 301 comprises:
a frequency variable local oscillator 311 for generating an oscillating signal, the frequency of the oscillating signal being swept in the same manner as in the first embodiment;
a second complex shifter 312 for shifting the digital converted signal stored in the memory 201 by the oscillating signal generated in the oscillator 311;
a matched filter 313 for producing a matched signal by filtering the frequency-shifted-signal generated in the second complex shifter 312, the matched signal being generated for each oscillating signal;
a maximum electric power detecting circuit 314 for detecting the maximum value of the electric power in the the matched signals, each value of the electric power of the matched signal being calculated in the circuit 314 in the same manner as in the first embodiment; and
an adjusting circuit 315 for adjusting the oscillating signal generated in the frequency variable local oscillator 311 for sweeping the oscillating frequency.

The frequency offset removing section 302 comprises:
a second frequency variable local oscillator 321 for generating a specific oscillating signal which is determined in the maximum electric power detecting circuit 314 by selecting the oscillating frequency in which the electric power calculated in the detecting circuit 314 becomes maximum, the frequency of the specific oscillating signal being transmitted from the control circuit 315 which has received the signal from the detecting circuit 314; and
a third complex shifter 322 for shifting the digital converted signal stored in the memory 201 by the specific oscillating signal generated in the second frequency variable local oscillator 321.

In the above configuration, the signal received at the receiving terminal 101 is stored in the memory 201 after being shifted in frequency, filtered, and converted in the same manner as in the second embodiment.

The frequency of the signal stored in the memory 201 is shifted by the oscillating signal generated in the frequency variable local oscillator 311. The oscillating frequency of the signal is adjusted from the lowest frequency f1 to the highest frequency f17 in turn. That is, each oscillating frequency of the signal is shifted by the digital converted signal stored in the memory 201 after completing the previous processing in which the lower oscillating frequency is processed as described hereinafter.

The frequency-shifted-signal is provided to the matched filter 313 to produce a matched signal in the same manner as in the first embodiment as shown in FIG. 1.

Thereafter, in the maximum electric power detecting circuit 314, the value of the electric power of the matched signal produced in the matched filter 313 is calculated and compared with the electric power data, which is stored in an internal memory, to select and store a larger electric power value and a corresponding oscillating frequency. That is, in the circuit 314, each electric power value of the matched signal is calculated and the largest electric power value and the corresponding oscillating frequency are always stored in the same manner in the electric power calculator 107, the electric power comparator/selector 108 and the memory 109 as in the first embodiment.

After detecting the maximum electric power, the detected information is transmitted to the adjusting circuit 315 to order the oscillator 311 to generate a new signal of a larger oscillating frequency. When the highest frequency f17 of the oscillating signal has already generated in the oscillator 311, the specific frequency of the oscillating signal, in which the maximum electric power is calculated in the detecting circuit 314, is transmitted to the second frequency variable local oscillator 321 and the clock 204.

In the local oscillator 321, after receiving the specific frequency data, the specific oscillating signal with the specific frequency is generated to be shifted by the digital converted signal stored in the memory 201. Therefore, the specific frequency-shifted-signal is generated in the shifter 322 and transmitted to a demodulator. In the specific frequency-shifted-signal, the frequency offset has not occurred because the electric power of the matched signal is maximum.

Also, in the clock 204, after receiving the specific oscillating frequency data, the clock is regenerated with accuracy by utilizing the frequency of the specific signal.

Accordingly, even if the burst signal is received in the receiving terminal, the frequency offset can be reliably removed in the frequency-offset removal apparatus according to the present invention in the same manner as in the first embodiment as shown in FIG. 1.

Also, the frequency offset can be reliably removed by utilizing only one burst signal without waiting for the next burst signal in the same manner as in the second embodiment as shown in FIG. 6.

Next, a fourth embodiment which is a modification of the second and third embodiment as shown in FIGS. 6, 7 is described with reference to FIG. 8.

Figure 8:
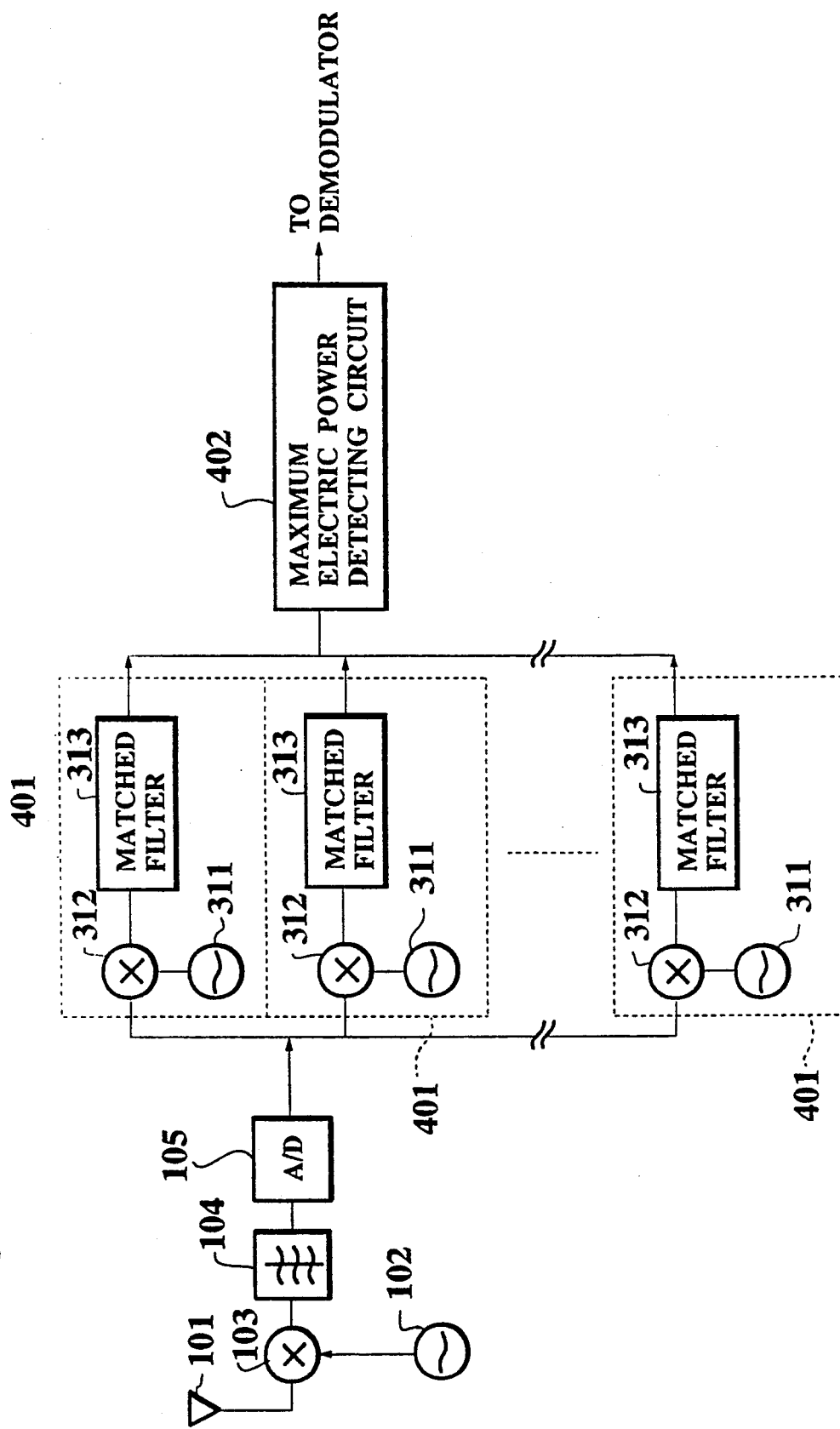
FIG. 8 is a block diagram of another frequency-offset removal apparatus according to the present invention, showing a fourth embodiment.

FIG. 8 is a block diagram of another frequency-offset removal apparatus according to the present invention.

As shown in FIG. 8, the frequency-offset removal apparatus comprises:
the receiving terminal 101;
the local oscillator 102;
the complex shifter 103;
the low-pass filter 104;
the analog-digital converter 105;
a plurality of frequency offset detecting sections 401 in which the frequency-shifted-signal shifted in the complex shifter 103 is remultiplied and filtered, each frequency offset detecting section 401 including the frequency variable local oscillator 311, the second complex shifter 312, and the matched filter 313 in parallel; and
a maximum electric power detecting section 402 for detecting the maximum value of the electric power which is selected by calculating the strength of the matched signal provided from each matched filter 313.

The maximum electric power detecting section 402 comprises a plurality of electric power calculators 107 and the electric power comparator 108.

In the above configuration, the frequency of the signal shifted in the complex shifter 103 is re-shifted in each frequency offset detecting section 401 simultaneously. Each resultant matched signal is provided to the maximum electric power detecting section 402 to select a specific frequency of the oscillating signal generated in one of the frequency variable local oscillators 311.

In detail, seventeen frequency offset detecting sections 401 are positioned in parallel and the first oscillating signal with the lowest frequency f1 is generated in the first detecting section 401. Also, each oscillating signal with the frequency f2, f3, ---, or f16 is generated in each section 401 and the 17th oscillating signal with the highest frequency f17 is generated in the 17th detecting section 401. Therefore, the 17 types of matched signals are provided to the maximum electric power detecting circuit 402 simultaneously.

In the detecting circuit 402, after receiving the 17 types of matched signals simultaneously, the electric power value of each matched signal is calculated in each corresponding electric power calculator 107 in the same manner as in the first embodiment. Each electric power value calculated in the corresponding electric power calculator 107 is compared to select one of the frequency offset detecting sections 401 in the electric power comparator 108. The selected detecting section 401 provides the specific matched signal with the largest electric power value in the matched signals. Then, the selected matched signal is immediately transmitted to a demodulator.

Accordingly, in the fourth embodiment, because the 17 types of matched signals are produced in the frequency offset detecting sections 401 simultaneously and the specific matched signal which has the largest electric power in the 17 types of matched signals has been selected, the processing time for selecting the specific matched signal can be drastically reduced as compared with the first to third embodiments.

Also, the memory 109, or 201 is not needed, but the seventeen detecting sections 401 are required.

Next, a fifth embodiment is described with reference to FIG. 9.

Figure 9:
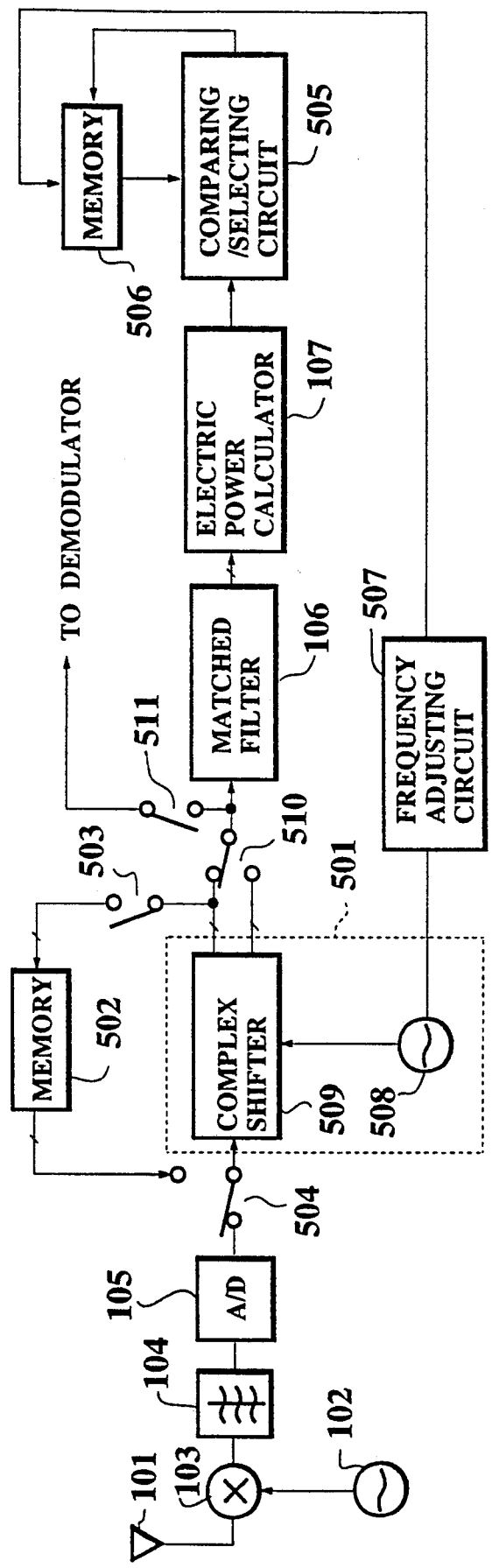
FIG. 9 is a block diagram of another frequency-offset removal apparatus according to the present invention, showing a fifth embodiment.

FIG. 9 is a block diagram of another frequency-offset removal apparatus according to the present invention.

As shown in FIG. 9, the frequency-offset removal apparatus comprises:
the receiving terminal 101;
the local oscillator 102;
the complex shifter 103;
the low-pass filter 104;
the analog-digital converter 105;
a frequency translation section 501 for translating the carrier frequency of the digital signal converted in the analog-digital converter 105;
a memory 502 for storing a frequency of an output signal from the frequency translation section 501 through a switch 503, the stored frequency being provided to the frequency translation section 501 through a switch 504;
a matched filter 106 in which the frequency-shifted-signal is received from the frequency translation section 501 through a switch 510;
the electric power calculator 107;
a comparing/selecting circuit 505 and a memory 506 for comparing the value of the electric power calculated in the electric power calculator 107 with the stored value of the memory 506; and a frequency adjusting circuit 507 for adjusting the frequency by which the carrier frequency of the digital signal is translated in the frequency translation section 501.

The frequency translation section 501 comprises:

a local oscillator 508 for generating an oscillating signal; and a complex shifter 509 for shifting the carrier frequency of the digital signal by the oscillating frequency of the signal generated in the local oscillator 508.

In the above configuration, when the carrier wave frequency of the received signal is detected, the switches are set to a prescribed position in advance. That is, the switch 503 is turned on, the switch 504 connects the analog-digital converter 105 to the complex shifter 509, and the switch 510 connects one terminal of the complex shifter 509, which is also connected to the memory 502, to the matched filter 106. Also, a switch 511 for connecting the frequency-offset removal apparatus to a demodulator is turned off.

In the above switch position, the signal received at the receiving terminal 101 is provided to the complex shifter 509 after being shifted in frequency in the complex shifter 103 to produce an IF signal or an orthogonal base-band signal, filtered in the low-pass filter 104, and converted to the digital signal in the analog-digital converter 105 in the same manner as in the first embodiment.

The digital converted signal provided to the complex shifter 509 has two components, specificaly, an inphase component (cosine wave) and a quadrature component (sine wave). In the complex shifter 509, each component of the digital converted signal is shifted in frequency with the inphase component of the oscillating signal generated in the local oscillator 508. Also, each component of the digital converted signal is shifted the frequency thereof with the quadrature component of the oscillating signal.

The function of the complex shifter 509 will be described in detail with reference to FIG. 10 as follows.

Figure 10:
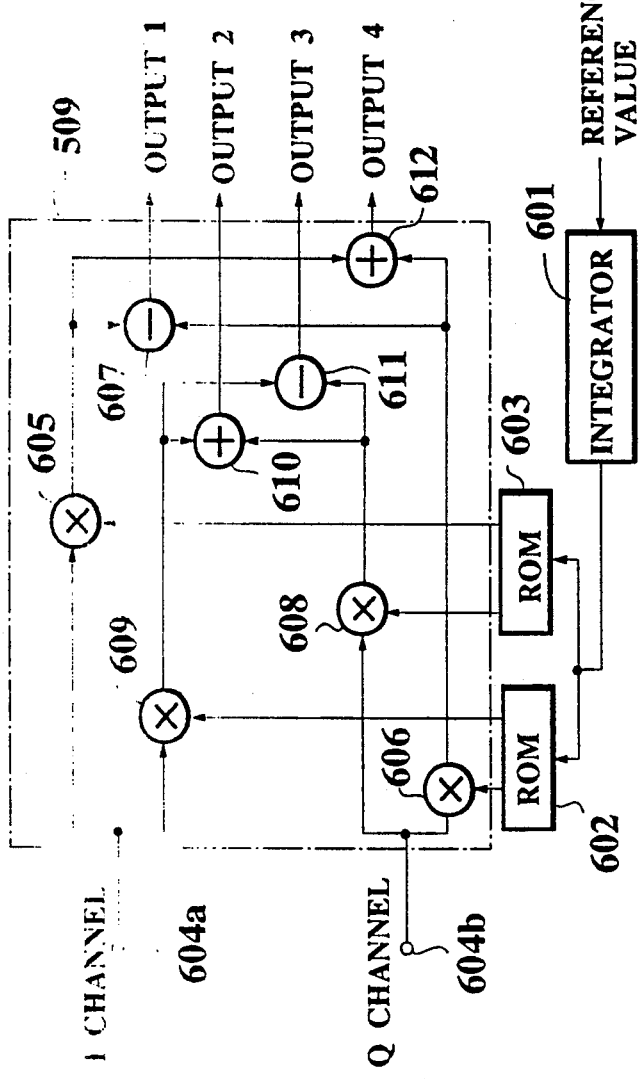
FIG. 10 is a block diagram for showing a function of a complex shifter as shown in FIG. 9.

As in the configuration of the frequency translation section 501 shown in FIG. 10, the local oscillator 508 comprises:

an integrator 601 for specifying a readout address of the inphase and quadrature components;

a read only memory (ROM) 602 for generating a cosine wave ( cos $\Phi t$); and a ROM 603 for generating a sine wave ( sin $\Phi t$).

The complex shifter 509 comprises:

an inphase (I) channel terminal 604a for receiving the inphase component ( cos $(\Delta\theta t + \phi)$) of the digital converted signal of which the frequency has been translated to the base-band frequency in the complex shifter 103;

a quadrature (Q) channel terminal 604b for receiving the quadrature component ( sin $(\Delta\theta t + \phi)$) of the digital converted signal;

a multiplier 605 for multiplying the inphase component of the digital converted signal by the sine wave generated in the ROM 603 to produce cos $(\Delta\theta t + \phi)$·sin $\Phi t$;

a multiplier 606 for multiplying the quadrature component of the digital converted signal by the cosine wave generated in the ROM 602 to produce sin $(\Delta\theta t + \phi)$·cos $\Phi t$;

a subtracter 607 for subtracting the output of the multiplier 606 from the output of the multiplier 605 to produce an output 1

$$\cos (\Delta\theta t + \phi)\cdot\sin \Phi t - \sin (\Delta\theta t + \phi)\cdot\cos \Phi t = \sin ((\Phi - \Delta\theta)t - \phi);$$

a multiplier 608 for multiplying the quadrature component of the digital converted signal by the sine wave generated in the ROM 603 to produce sin $(\Delta\theta t + \phi)$·sin $\Phi t$;

a multiplier 609 for multiplying the inphase component of the digital converted signal by the cosine wave generated in the ROM 602 to produce cos $(\Delta\theta t + \phi)$·cos $\Phi t$;

an adder 610 for adding the output of the multiplier 608 to the output of the multiplier 609 to produce an output 2

$$\cos (\Delta\theta t + \phi)\cdot\cos \Phi t + \sin (\Delta\theta t + \phi)\cdot\sin \Phi t = \cos ((\Phi - \Delta\theta)t - \phi);$$

a subtracter 611 for subtracting the output of the multiplier 608 from the output of the multiplier 609 to produce an output 3

$$\cos (\Delta\theta t + \phi)\cdot\cos \Phi t - \sin (\Delta\theta t + \phi)\cdot\sin \Phi t = \cos ((\Phi + \Delta\theta)t + \phi);$$

and an adder 612 for adding the output of the multiplier 606 to the output of the multiplier 605 to produce an output 4

$$\cos (\Delta\theta t + \phi)\cdot\sin \Phi t + \sin (\Delta\theta t + \phi)\cdot\cos \Phi t = \sin ((\Phi + \Delta\theta)t + \phi).$$

In the above configuration of the frequency translation section 501, by setting the frequency of the output of the ROMs 602, 603 to the frequency fc (fc=$\Phi/2\pi$), and by setting the difference between the frequency fc and the frequency of the carrier wave of the signal received in the receiving terminal 101 to the value $\Delta$fd, the frequency $(\Phi - \Delta\theta)/2\pi$ of the outputs 1, 2 is equal to fc$-\Delta$fd. Also, the frequency $(\Phi + \Delta\theta)/2\pi$ of the outputs 3, 4 is equal to fc$+\Delta$fd.

Accordingly, when the output terminals 1, 2 providing the frequency fc$-\Delta$fd are selected by the switch 510, the electric power value of the carrier wave of the signal received in the receiving terminal 101 can be calculated from the value $\sin^2$ (fc$-\Delta$fd)+$\cos^2$ (fc$-\Delta$fd). That is, the value $\sin^2$ (fc$-\Delta$fd) and $\cos^2$ (fc$-\Delta$fd) are respectively obtained by connecting the switch 510 with the output 1 and the output 2 in turn. In the same manner, when the output terminals 3, 4 providing the frequency fc$+\Delta$fd are selected, the electric power value of the carrier wave can be calculated from the value $\sin^2$ (fc$+\Delta$fd)+$\cos^2$ (fc$+\Delta$fd) by connecting the switch 510 with the output 3 and the output 4 in turn.

Turning to FIG. 9, in the frequency translation section 501, the oscillating frequency of the local oscillator 508 is adjusted to fc at first under the control of the frequency adjusting circuit 507 to detect the carrier frequency of the signal received in the receiving terminal 101. Therefore, two types of output signals with the frequencies fc$-\Delta$fd and fc$+\Delta$fd are respectively provided from the complex shifter 509 as described in FIG. 10. One frequency fc$-\Delta$fd of the output signals of the complex shifter 509 is stored in the memory 502 through the switch 503 to provide the stored data to the complex shifter 509 at the next step.

At the same time, the frequency-shifted-signal of the complex shifter 509 is provided to the matched filter 106 before calculating the electric power value of the signal in the electric power calculator 107. Then, the signal is stored in the memory 506 through the comparing/selecting circuit 505.

Thereafter, the switch 503 is turned off and the switch 504 is changed to connect the shifter 509 with the memory 502, while the switches 510, 511 are not changed. With the above switch position, the frequency data stored in the memory 502 is provided to the complex shifter 509 through the switch 504. At this time, the oscillating frequency of the local oscillator 508 is adjusted to the prescribed frequency $\Delta fd$ ($\Delta fd < 2/NT$). Then, the oscillating signal of the local oscillator 508 is provided to in shifter 509 so that the signal shifted the frequency by the shifter 509 is filtered in the matched filter 106 and calculated in the electric power calculator 107, and the calculated electric power is compared with the data stored in the memory 506. After the comparison, the larger electric power is selected in the selector 505, and the selected electric power value and the frequency provided from the output terminal of the shifter 509 connected with the matched filter 106 are stored in the memory 506.

For example, to explain the switching operation specifically, the switch 510 connects the output terminals 1, 2 of the shifter 509 as shown in FIG. 9 so that the frequency $fc - \Delta fd$ is selected because the stored data is initially "0". Thereafter, the switch 510 is changed to connect the matched filter 106 to the output terminals 3, 4 of the shifter 509 to transmit the frequency $fc + \Delta fd$. Also, the switch 503 is turned on, the switch 511 is turned off, and the switch 504 is changed to connect the converter 105 to the shifter 509.

In the above switch position, the frequency $fc - \Delta fd$ of the output signals of the complex shifter 509 is stored in the memory 502 through the switch 503 to provide the stored data to the complex shifter 509 in the next step.

Thereafter, the frequency-shifted-signal (the frequency $fc + \Delta fd$) of the complex shifter 509 is provided to the matched filter 106 before the calculation of the electric power of the signal in the electric power calculator 107. Then, the signal is stored in the memory 506 through the comparing/selecting circuit 505.

Thereafter, the switch 503 is turned off and the switch 504 is changed to connect the shifter 509 to the memory 502, while the switches 510, 511 are not changed. With the above switch position, the frequency data stored in the memory 502 is provided to the complex shifter 509 through the switch 504. At this time, the oscillating frequency of the local oscillator 508 is adjusted to the prescribed frequency $\Delta fd$ ($\Delta fd < 2/NT$). Then, the oscillating signal of the local oscillator 508 is provided to the shifter 509 so that the signal shifted in frequency by the shifter 509 is filtered in the matched filter 106 and calculated in the electric power calculator 107, and the calculated electric power is compared with the data stored in the memory 506. The frequency $fc - \Delta fd$ and the corresponding electric power value have already been stored in the memory 506. After the comparison, the larger electric power value is selected in the selector 505, and the selected electric power value and the corresponding frequency are stored in the memory 506.

Thereafter, the oscillating frequency is adjusted to $k\Delta fd$ ($= 1, 2, 3, ***, n$) in turn for the following detection to select the largest electric power value and the corresponding frequency. This operation is continued until the frequency in the range $fc - n\Delta fd < f < fc + n\Delta fd$ is swept. After detection of the carrier wave frequency, the oscillating frequency is adjusted to the detected frequency. That is, the switch 503 is turned off, the switch 511 is turned on, and the switch 504 is changed to connect the shifter 509 to the memory 502. Also, the switch 510 is changed to connect with the determined output in the shifter 509.

Accordingly, the signal received in the receiving terminal 101 can be translated to the base band frequency and the frequency offset can be removed so that the signal then be transmitted to the demodulator through the switch 511.

Also, in the complex shifter 509, two types of frequencies are provided so that the number of calculations can be reduced to half as compared with the ordinary shifter which provides only one frequency.

Next, a sixth embodiment is described with reference to FIGS. 11, 12.

Figure 11:
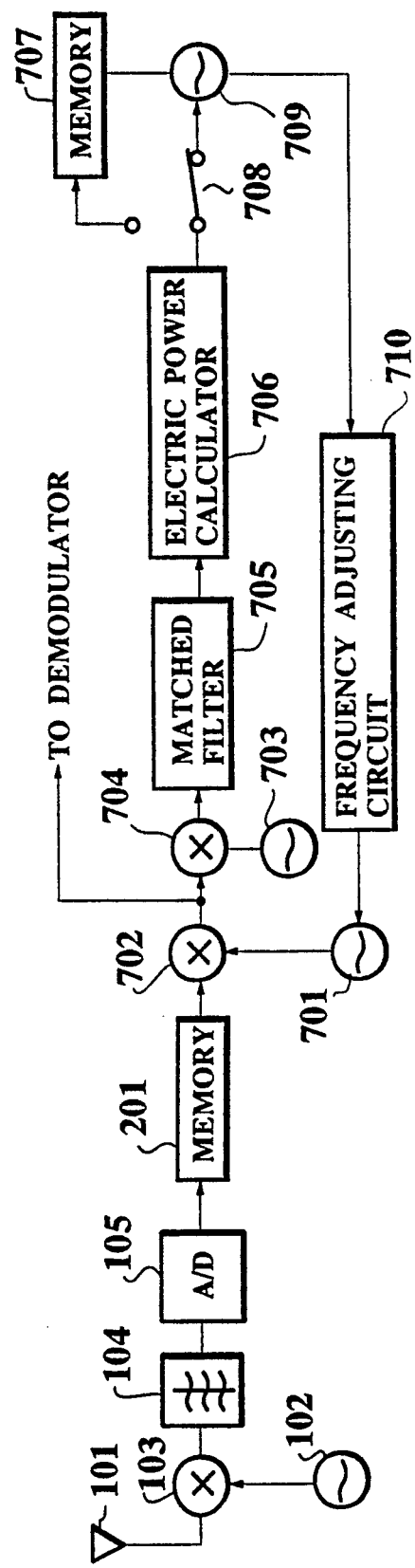
FIG. 11 is a block diagram of another frequency-offset removal apparatus according to the present invention, showing a sixth embodiment.

FIG. 11 is a block diagram of another frequency-offset removal apparatus according to the present invention.

As shown in FIG. 11, the frequency-offset removal apparatus comprises:
the receiving terminal 101;
the local oscillator 102;
the complex shifter 103;
the low-pass filter 104;
the analog-digital converter 105;
the memory 201;
a second local oscillator 701 for generating a variable oscillating signal;
a second complex shifter 702 for shifting the digital converted signal stored in the memory 201 by the oscillating signal generated in the local oscillator 701 to translate the frequency of the frequency-shifted-signal to the base band frequency, the frequency-shifted-signal still having a variable frequency offset $\Delta fm$;
a third local oscillator 703 for generating two types of oscillating signals, one signal having a frequency $\Delta f$ and another signal having a frequency $-\Delta f$;
a third complex shifter 704 for re-shifting the signal shifted in frequency in the second complex shifter 702 by the oscillating signal generated in the third local oscillator 703 to produce a frequency-shifted-signal which has a frequency offset $\Delta fm + \Delta fd$ or $\Delta fm - \Delta fd$ according to the frequency of the oscillating signal;
a matched filter 705 for filtering and producing a matched signal with the frequency offset $\Delta fm + \Delta fd$ or $\Delta fm - \Delta fd$ from the signal shifted the frequency thereof in the third complex shifter 704;
an electric power calculator 706 for calculating the electric power value of the matched signal filtered in the matched filter 705;
a memory 707 for storing one electric power value corresponding to the matched signal with the frequency offset $\Delta fm - \Delta fd$ through a switch 708;
a subtracter 709 for substracting another electric power value corresponding to the matched signal with the frequency offset $\Delta fm + \Delta fd$ through the switch 708 from the one electric power value stored in the memory 707;
a frequency adjusting circuit 710 for adjusting the frequency of the oscillating signal generated in the local oscillator 701 by using the electric power difference in values obtained in the subtractor 709.

In the above configuration, the signal received at the receiving terminal 101 is provided to the memory 201 after being shifted in frequency by the complex shifter 103, filtered in the low-pass filter 104, and converted to a digital signal in the analog-digital converter 105 in the same manner as in the first embodiment.

The signal stored in the memory 201 is shifted in frequency by the oscillating signal generated in the local oscillator 701 to translate the frequency of the signal to the base band frequency in the shifter 702. The frequency-shifted-signal produced in the shifter 702 has a frequency offset $\Delta fm = \Delta fm1$ as shown in FIG. 12.

In the shifter 704, the frequency-shifted-signal is re-shifted in frequency by the oscillating signal, which has the frequency $+\Delta fd$, generated in the local oscillator 703. That is, a first frequency-offset signal, which has the frequency offset $\Delta fm1 + \Delta fd$, is produced. The first frequency-offset signal is filtered in the matched filter 705 so that the electric power value of the first signal is calculated in the calculator 706. The electric power value is stored in the memory 709 through the switch 708. That is, the first frequency-offset signal with the frequency offset $\Delta fm1 + \Delta fd$ has the electric power value EP1 as shown in FIG. 12.

Thereafter, the switch 708 is changed to connect the calculator 706 to the subtractor 709 and the oscillating frequency of the signal generated in the local oscillator 703 is changed to the frequency $-\Delta fd$. Then, the signal stored in the memory 201 is shifted in frequency with the oscillating signals of the oscillators 701, 703 to produce a second frequency-offset signal with the frequency offset $\Delta fm1 - \Delta fd$ and filtered in the matched filter 705, and the electric power value of the second signal is calculated in the calculator 706 so that the electric power value is provided to the subtractor 709. That is, the second frequency-offset signal with the frequency offset $\Delta fm1 - \Delta fd$ has the electric power value EP2 as shown in FIG. 12.

In the subtracter 709, the electric power values difference in the first and second frequency-offset signals is calculated. That is, the difference value $\Delta W$ is equal to EP1 − EP2 as shown in FIG. 12. The difference $\Delta W$ is positive in this embodiment.

After calculating the difference in the subtracter 709, the difference $\Delta W$ is transmitted to the frequency adjusting circuit 710 so that the oscillating frequency of the signal generated in the local oscillator 701 is changed to reduce the difference in the next step. That is, the oscillating frequency is increased by a prescribed frequency proportional to the absolute value $|\Delta W|$ because the difference $\Delta W$ is positive in this embodiment, while the oscillating frequency is decreased when the difference $\Delta W$ is negative. As shown in FIG. 12, by carrying out several steps, the frequency offset $\Delta fm$ of the signal stored in the memory 201 is changed to $\Delta fm1 \rightarrow \Delta fm2 \rightarrow \Delta fm3$ step by step to remove the frequency offset.

When the difference $\Delta W$ becomes zero, the frequency offset of the signal stored in the memory 201 is removed.

In the above operation, the feature of this embodiment is described as compared with the previous embodiments.

Figure 12:
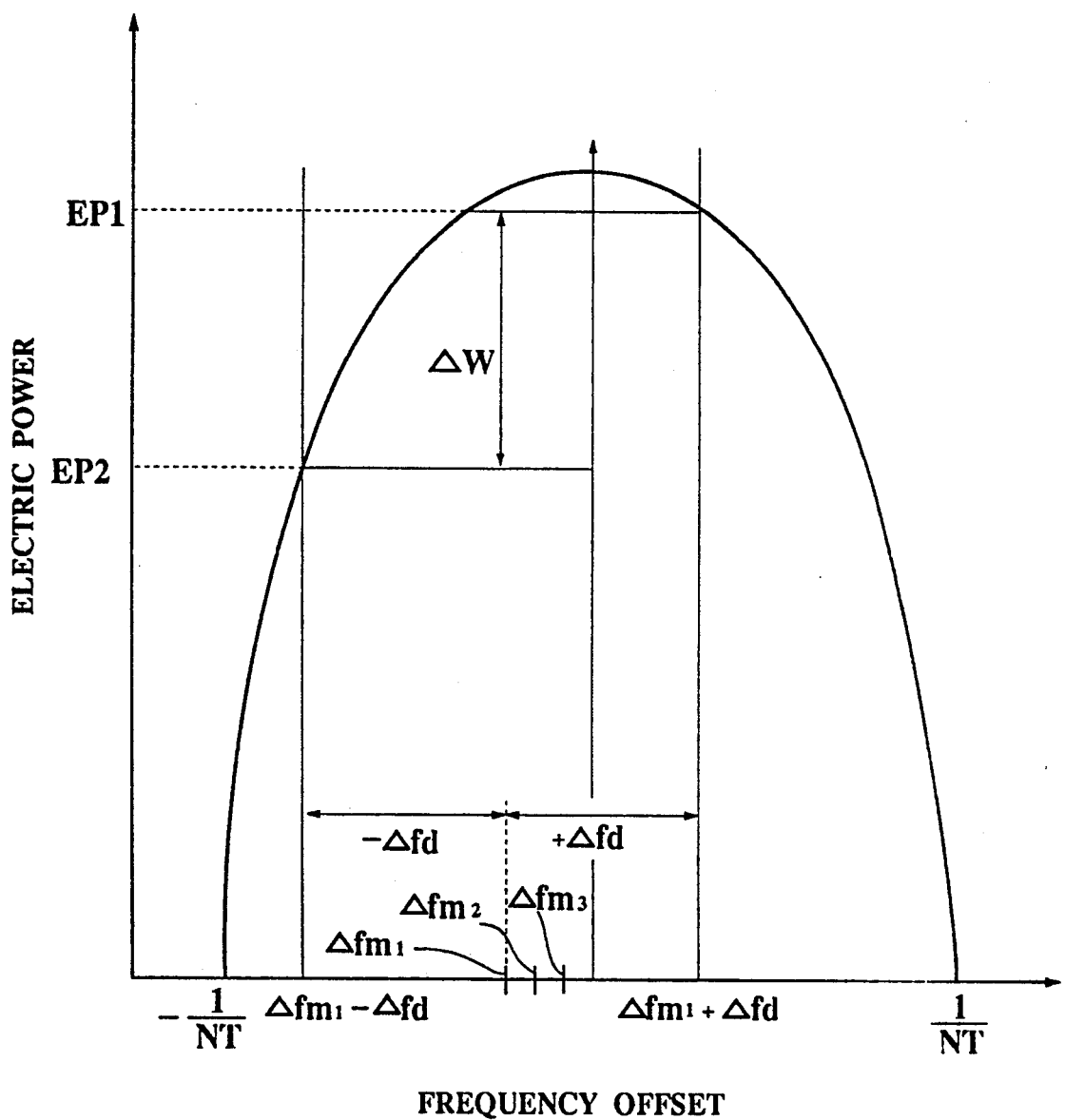
FIG. 12 shows an adjusting method used in the apparatus as shown in FIGS. 11, 13, 14 for removing a frequency offset with high accuracy.

With reference to FIG. 12, the change in the electric power value is small in the area near the peak point at which the frequency offset is zero, while the change in the electric power value is very large in the other area apart from the peak point. Therefore, in the previous embodiments, it is difficult to adjust the frequency to remove the frequency offset with accuracy because the change of the electric power is too small to compare two electric power values in the comparator 108, 314, 505. That is, the previous embodiments are suitable for roughly adjusting the frequency and for promptly pre-adjusting the frequency.

On the other hand, in the sixth embodiment, even if the frequency-shifted-signal generated in the shifter 702 has a small frequency offset ($\Delta fm \approx 0$) after adjusting the frequency of the signal in several steps, the frequency of the re-shifted signals generated in the third shifter 704 have offset values $+\Delta fd$ and $-\Delta fd$. Therefore, the change in the electric power value is large for the above signals. That is, even if the frequency offset $\Delta fm$ is almost zero, the frequency-shifted-signal generated in the shifter 702 can be adjusted to the frequency offset $\Delta fm = 0$ with high accuracy.

Accordingly, the oscillating frequency can be adjusted with high accuracy to remove the frequency offset in the present embodiment.

Also, if a burst signal is received in the receiving terminal, the frequency offset is rapidly removed in the same manner as in the previous embodiments.

Next, a seventh embodiment is described with reference to FIG. 13.

Figure 13:
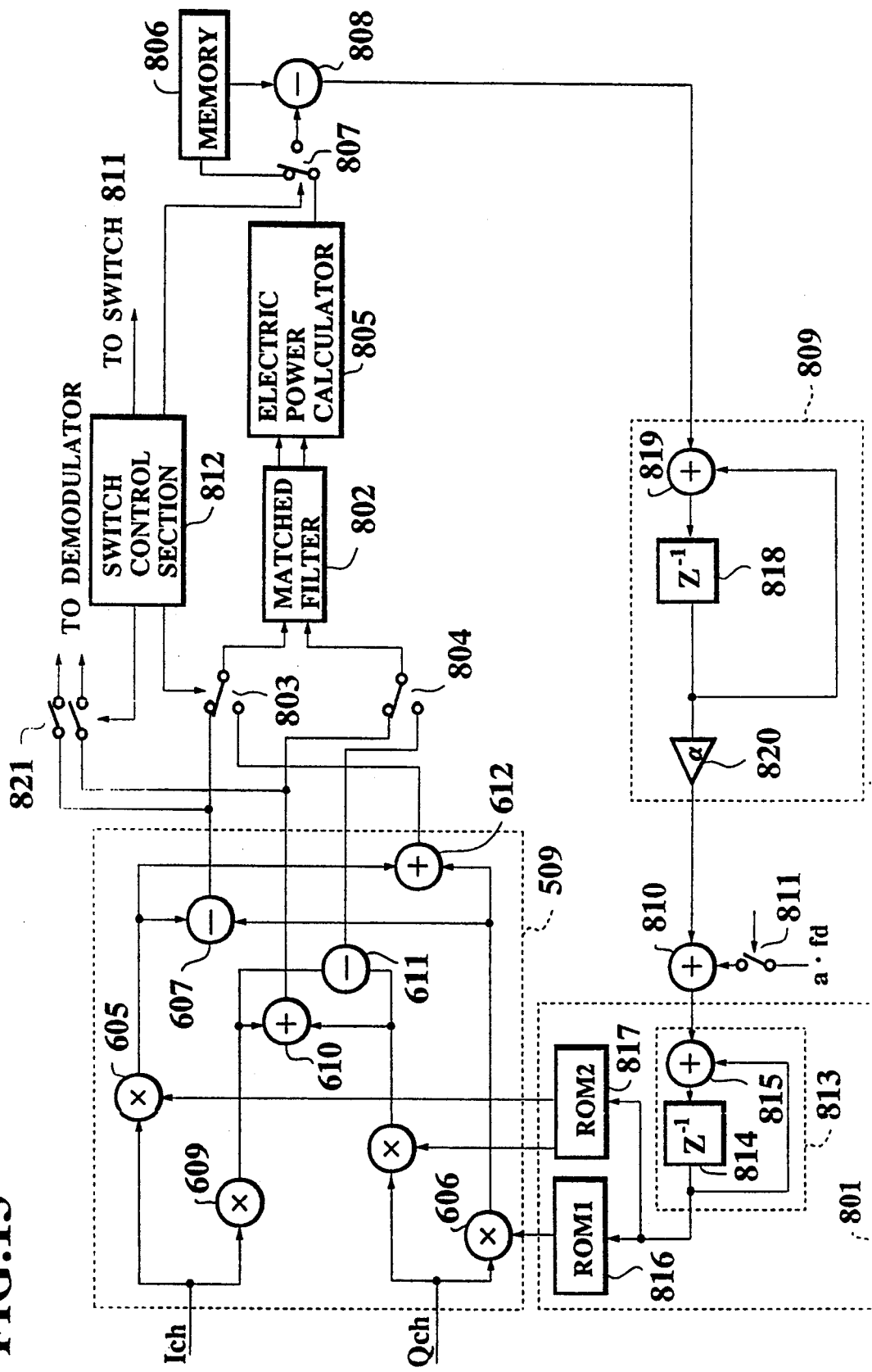
FIG. 13 is a block diagram of another frequency-offset removal apparatus according to the present invention, showing a seventh embodiment.

FIG. 13 is a block diagram of another frequency-offset removal apparatus according to the present invention.

As shown in FIG. 13, the frequency-offset removal apparatus comprises:

the receiving terminal 101 (not shown);
the local oscillator 102 (not shown);
the complex shifter 103 (not shown);
the low-pass filter 104 (not shown);
the analog-digital converter 105 (not shown);
the memory 201 (not shown) for storing the digital signal converted in the analog-digital converter 105, the stored signal having a frequency offset $\Delta fm$ and being translated to the base band frequency;
a second local oscillator 801 for generating an oscillating signal, the oscillating signal having a frequency $\Delta fd$;
the complex shifter 509 for shifting the signal stored in the memory 201 by the oscillating signal generated in the local oscillator 801 to produce a first frequency-offset signal with the frequency offset $\Delta fm + k\Delta fd$ or a second frequency-offset signal with the frequency offset $\Delta fm - k\Delta fd$;
a matched filter 802 for filtering the frequency-shifted-signal provided from the complex shifter 509 through a switch 803 or a switch 804 to produce a matched signal with the frequency offset $\Delta fm + k\Delta fd$ or $\Delta fm - k\Delta fd$;
an electric power calculator 805 for calculating the electric power of the matched signal provided from the matched filter 802;
a memory 806 for storing the electric power of the matched signal through a switch 807, the matched signal having the frequency offset $\Delta fm - k\Delta fd$;
a subtracter 808 for subtracting the electric power value of the other matched signal with the offset frequency $\Delta fm + k\Delta fd$ from the electric power value stored in the memory 806;
a loop filter 809 for adding the subtracted value;
an adder 810 for adding a constant a·fd through a switch 811 for adjusting the oscillating frequency of the local oscillator 801; and a switch control section 812 for controlling the switches 803, 804, 807, 811 and a switch 821 connecting the apparatus to a demodulator.

The second local oscillator 801 comprises:

a cumulative adder 813 for multiplying a control signal provided from the adder 810;

a ROM 816 for generating a cosine wave (cos Φt) which is provided to the multipliers 606, 609, the amount of phase being designated by the cumulative adder 813; and a ROM 817 for generating a sine wave (sin Φt) which is provided to the multipliers 605, 608, the amount of phase being designated by the cumulative adder 813.

The cumulative adder 813 includes:

a temporary storage 814; and an adder 815 for adding the control signal and a signal provided from the temporary storage 814 to decrease the electric power value difference obtained in the subtracter 808 at a prescribed time-constant and providing a resultant signal to the temporary storage 814. The cumulative adder 813 provides a control signal to the local oscillator 102 to reduce the frequency offset $|\Delta fm|$ of the converted signal stored in the memory 201

The loop filter 809 comprises:

a temporary storage 818;

an adder 819 for adding a control signal provided from the subtracter 808 and a signal provided from the temporary storage 818 to provide a resultant signal to the temporary storage 818; and a buffer amplifier 820 for amplifying the resultant signal provided from the temporary storage 818.

In the above configuration, after turning on the switch 811, the constant a·fd is provided to the local oscillator 801 through the adder 810 to provide oscillating signals having the frequency Δfd from the local oscillator 801 to the shifter 509. Then, in the complex shifter 509, the oscillating signals are respectively shifted the frequency thereof with the digital converted signals which are respectively provided to the I channel terminal and Q channel terminal in the same manner as in the fifth embodiment.

Therefore, in the complex shifter 509, the quadrature component with the frequency Δfm−Δfd (sin (Δfm−Δfd)) is provided to the output 1 from the subtracter 607 and the quadrature component with the frequency Δfm+Δfd ( sin (Δfm+Δfd)) is provided to the output 4 from the adder 612. The outputs 1, 4 are changed over by the switch 803.

Also, the inphase component with the frequency Δfm−Δfd (cos (Δfm−Δfd)) is provided to the output 2 from the adder 610 and the inphase component with the frequency Δfm+Δfd (cos (Δfm+Δfd)) is provided to the output 2 from the subtracter 611. The outputs 2, 3 are changed over by the switch 804.

First, under the control of the switch control section 812, the switches 803, 804 are positioned to connect the outputs 1, 2 to the matched filter 802 and the switch 807 is positioned to connect the memory 806 to the calculator 805. Then, the electric power values of the received signal with the sine and cosine waves are respectively calculated in the electric power calculator 805 and stored in the memory 806 through the switch 807. In other words, the electric power of the received signal with the frequency offset Δfm−Δfd is stored in the memory 806.

Secondly, under the control of the switch control section 812, the switches 803, 804 are changed over to connect the outputs 3, 4 to the matched filter 802 and the switch 807 is changed over to connect the subtracter 808 to the calculator 805. Then, the electric power values of the received signals with the sine and cosine waves are respectively calculated in the electric power calculator 805 and transmitted to the subtracter 808 through the switch 807. In other words, the electric power value of the received signal with the frequency offset Δfm+Δfd is transmitted to the subtracter 808.

In the subtracter 808, the difference between the calculated electric power values is calculated and transmitted to the local oscillator 801 through the loop filter 809 and the adder 810.

In the local oscillator 801, a control signal for reducing the frequency offset Δfm of the converted signal stored in the memory 201 is generated in the same manner as in the sixth embodiment. Therefore, the local oscillator 102 generates a specific oscillating signal which has the same frequency as the carrier frequency of the received signal so that the frequency offset Δfm becomes zero.

After removing the frequency offset, under the control of the switch control section 812, the switch 811 is turned off and the switch 821 is turned on to transmit the quadrature and inphase components provided from the subtracter 607 and the adder 610 to the demodulator.

Accordingly, in the seventh embodiment, two types of the frequencies are provided in the complex shifter 509 so that the number of calculations can be reduced to half as compared with the ordinary shifter which provides only one frequency in the same manner as in the fifth embodiment.

Also, the oscillating frequency can be adjusted with high accuracy to remove the frequency offset in the same manner as in the sixth embodiment.

Moreover, even if a burst signal is received in the receiving terminal, the frequency offset can be rapidly removed in the same manner as in the previous embodiments.

Next, an eighth embodiment is described with reference to FIG. 14.

Figure 14:
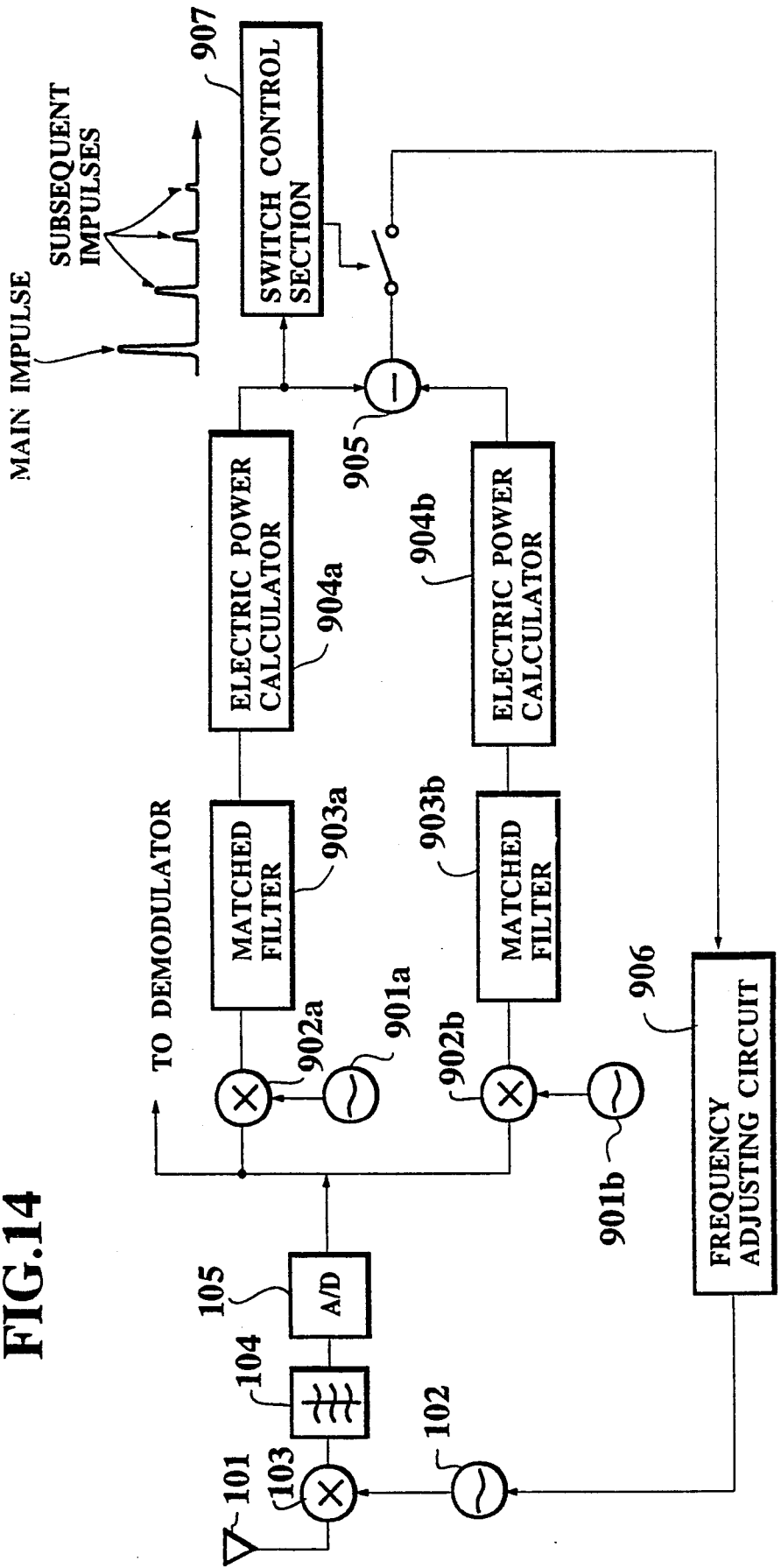
FIG. 14 is a block diagram of another frequency-offset removal apparatus according to the present invention. showing a eighth embodiment.

FIG. 14 is a block diagram of another frequency-offset removal apparatus according to the present invention.

As shown in FIG. 14, the frequency-offset removal apparatus comprises:

the receiving terminal 101;

the local oscillator 102;

the complex shifter 103;

the low-pass filter 104;

the analog-digital converter 105;

a pair of local oscillators 901a, 901b for generating oscillating signals, the oscillator 901a generating the oscillating signal of the frequency +Δfd and the oscillator 901b generating the oscillating signal of the frequency −Δfd;

a pair of complex shifters 902a, 902b for shifting the digital signal converted in the converter 105 by the oscillating signals;

a pair of matched filters 903a, 903b for filtering the converted signals shifted the frequency thereof in the shifters 902a, 902b, each converted signal being changed to a main impulse and subsequent smaller impulses;

a pair of electric power calculators 904a, 904b for calculating each electric power value of the impulses produced in the matched filters 903a, 903b;

a subtracter 905 for calculating the difference between the electric power values of the main impulses provided from the electric power calculators 904a, 904b;

a frequency adjusting circuit 906 for adjusting the frequency of the oscillating signal generated in the local oscillator 102 proportional to the difference calculated in the subtracter 905 to reduce the frequency offset generated in the shifter 103; and a switch control section 907 for turning on a switch 908 when the electric power value of the main impulse is provided from the calculator 904a and turning off this switch 908 when the electric power value of the other impulse is provided from the calculator 904a, the switch 908 connecting the subtracter 905 to the frequency adjusting circuit 906.

In the above configuration, the receiving terminal 101 receives a burst signal which is distorted for multipath transmission in communication with a mobile station. Then, the received signal is shifted in frequency by the shifter 103, filtered in the low-pass filter 104, and converted in the analog-digital converter 105. The converted signal has the frequency offset $\Delta fm$ because the carrier frequency of the received signal is not identical with the frequency of the oscillating signal.

Thereafter, the converted signal is re-shifted the frequency thereof in the shifters 902a, 902b respectively. Therefore, a first signal shifted in frequency by the shifters 902a has the frequency offset $\Delta fm + \Delta fd$, while a second signal shifted in frequency by the shifters 902b has the frequency offset $\Delta fm - \Delta fd$. The first and second signals are then filtered in the matched filters 903a, 903b. The filtered signal have a main impulse and subsequent smaller impulses because the received signal is distorted for multipath transmission.

The distortion occurs because the direct ray and delayed ray are multiplexed and received. The matched filter can separate this direct ray and delayed ray. Therefore, the influence of the multipath can be mitigated.

In the electric power calculator 904a, 904b, the electric power values of the filtered signals are calculated for the main and the subsequent impulses. After calculating each electric power value, the difference in the values, for example, the difference between the electric values of the main impulses is calculated in the subtracter 905.

When the switch control section 907 detects the main impulse at the output terminal of the calculator 904a, the switch 908 is turned on so that the difference between the electric values of the main impulses is transmitted to the frequency adjusting circuit 906. On the other hand, when the switch control section 907 detects the other impulse at the output terminal of the calculator 904a, the switch 908 is turned off so that the difference between the electric values of the other impulses is not transmitted to the frequency adjusting circuit 906.

In the frequency adjusting circuit 906, an adjusted signal is produced by using the difference in values of the electric power received from the subtracter 905 in the same manner as in the sixth embodiment with reference to FIG. 12, and provided to the local oscillator 102. Therefore, the oscillator 102 generates the other oscillating signal to reduce the difference calculated in the subtracter 905.

Accordingly, in this embodiment, the oscillating frequency can be adjusted with high accuracy to remove the frequency offset in the same manner as in the sixth embodiment.

Also, the frequency offset can be removed more rapidly than in the sixth embodiment because the shifters 902a, 902b, the matched filter 903a, 903b, and the calculator 904a, 904b are operated in parallel.

Moreover, even if a distorted burst signal is received in the receiving terminal 101, the frequency offset can be rapidly and reliably removed because only the electric power values of the main impulses are utilized for adjusting the frequency of the oscillating signal.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A frequency-offset removal apparatus, comprising:
   a receiving section for receiving a signal including training sequence:
   a first local oscillator for generating a first oscillating signal to synchronize with the signal received in the receiving section;
   a first shifter for shifting the signal received in the receiving section by the oscillating signal generated in the first local oscillator;
   a plurality of second shifters for re-shifting the signal shifted the frequency thereof in the first shifter by each second oscillating signal generated in each second local oscillator, a group of frequencies of the second oscillating signals ranging from high frequency to low frequency through a specific frequency by which the frequency-offset between the second oscillating signal and the carrier frequency of the signal received in the receiving section becomes zero;
   a plurality of matched filters for producing matched signals from the frequency re-shifted signals, the strength of each matched signal being changed according to the value of the frequency offset of the frequency-shifted-signal generated in the second shifter and reaching the largest value when the value of the frequency offset is zero;
   a plurality of electric power calculators for calculating each electric power value of the matched signal generated in the matched filter; and
   a selecting section for selecting one frequency re-shifted signal with the maximum electric power, the frequency-reshifted-signal being sent to a demodulator.

2. A frequency-offset removal apparatus, comprising:
   a receiving section for receiving a signal formed in a prescribed pattern;
   a local oscillator for generating an oscillating signal to synchronize with the signal received in the receiving section;
   a frequency shifting section for shifting the carrier frequency of the received signal by a prescribed oscillating signal generated in the local oscillator;
   a pair of shifters for re-shifting the frequency-shifted-signal generated in the frequency shifting section to produce first and second signals respectively, the first signal having the frequency offset $\Delta fm + \Delta fd$ and the second signal having the frequency offset $\Delta fm - \Delta fd$;

a comparing/calculating section for calculating the difference between first and second matched filter output power, the first matched filter output power being obtained by feeding the first signal into a matched filter before calculating the output power and the second matched filter output power being obtained by feeding the second signal into the matched filter before calculating the output power; and a frequency adjusting section for adjusting the frequency of the oscillating signal generated in the local oscillator to produce a specific frequency re-shifted signal which has no frequency offset, the specific frequency re-shifted signal being sent to a demodulator.

3. A apparatus according to claim 2 in which the comparing/calculating section includes:

a pair of matched filters for providing first and second matched signals respectively, each matched signal containing a main impulse and subsequent smaller impulses and the strength of the signal being changed according to the value of the frequency offset of the first or second signal generated in each shifter and reaching the largest value when the value of the frequency offset is zero;

a pair of electric power calculators for calculating the electric power of each matched signal generated in the matched filter;

an electric power subtracter for calculating the difference in the electric power values of the matched signals, the difference of the electric power values being almost proportional to the frequency offset $\Delta fm$; and a control section for providing the difference in the electric power values of the matched signals calculated in the subtracter to the frequency adjusting section when the difference in the electric power between the main impulses is calculated in the subtracter.

4. A frequency-offset removal method, comprising:
receiving a signal formed in a prescribed pattern;
generating an oscillating signal to synchronize with the received signal in a first local oscillator;
shifting the carrier frequency of the received signal by a prescribed oscillating signal in a first shifter;
reshifting the frequency-shifted-signal in a plurality of second shifters simultaneously by each second oscillating signal generated in each second local oscillator, a group of frequencies of the second oscillating signals ranging from high frequency to low frequency through a specific frequency by which the frequency-offset between the second oscillating signal and the carrier frequency of the received signal becomes zero;
producing matched signals from the frequency-reshifted-signals in a plurality of matched filters simultaneously, the strength of each matched signal being changed according to the absolute value of the frequency offset of the frequency-reshifted-signal and reaching the largest value when the value of the frequency offset is zero;
calculating each electric power of the matched signal in a plurality of electric power calculator; and
selecting one frequency-reshifted-signal with the maximum value of the electric power, the frequency-reshifted-signal being sent to a demodulator.

5. A frequency-offset removal method, comprising:
receiving a signal formed in a prescribed pattern;
generating an oscillating signal to synchronize with the received signal;
shifting the carrier frequency of the received signal by a prescribed oscillating signal;
reshifting the frequency-shifted-signal by each oscillating signal to produce first and second signals respectively, the first signal having the frequency offset $\Delta fm + \Delta fd$ and the second signal having the frequency offset $\Delta fm - \Delta fd$;
providing first and second matched signals respectively, each matched signal containing a main impulse and subsequent smaller impulses and the strength of the signal being changed according to the value of the frequency offset of the first or second signal and reaching the largest value when the value of the frequency offset is zero;
calculating the electric power of each matched signal;
calculating the difference in the electric power values of the matched signals, the difference in the electric power values being almost proportional to the difference in the frequency offset between the first and second signals;
providing the difference in the electric power values of the matched signals to a frequency adjusting section when the difference in the electric power of the main impulses is calculated; and
adjusting the frequency of the oscillating signal in the frequency adjusting section to produce a specific frequency-reshifted-signal which has no frequency offset, the specific frequency-reshifted-signal being sent to a demodulator.

6. A frequency-offset removal method, comprising:
receiving a signal formed in a prescribed pattern;
generating an oscillating signal to synchronize with the received signal in a first local oscillator;
shifting the carrier frequency of the received signal by a prescribed oscillating signal in a first shifter;
reshifting the frequency-shifted-signal in a plurality of second shifters simultaneously by each second oscillating signal generated in each second local oscillator, a group of frequencies of the second oscillating signals ranging from high frequency to low frequency through a specific frequency by which the frequency-offset between the second oscillating signal and the carrier frequency of the received signal becomes zero;
producing matched signals from the frequency-reshifted-signals in a plurality of matched filters simultaneously, the strength of each matched signal being changed according to the absolute value of the frequency offset of the frequency-reshifted-signal and reaching the largest value when the value of the frequency offset is zero;
calculating each electric power of the matched signal in a plurality of electric power calculator, the difference in the electric power values being almost proportional to the difference in the frequency offset;
selecting one frequency-reshifted-signal with the maximum value of the electric power;
shifting the frequency-reshifted-signal by each oscillating signal to produce first signal and second signals respectively, the first signal having the frequency offset $\Delta fm + \Delta fd$ and the second signal having the frequency offset $\Delta fm - \Delta fd$;

providing first and second matched signals respectively, each matched signal containing a main impulse and subsequent smaller impulses;

calculating the electric power of each matched signal;

calculating the difference in the electric power values of the matched signals;

providing the difference in the electric power values of the matched signals to a frequency adjusting section when the difference in the electric power of the main impulses is calculated; and adjusting the frequency of the oscillating signal in the frequency adjusting section to produce a specific frequency-reshifted-signal which has no frequency offset, the specific frequency-reshifted-signal being sent to a demodulator.

7. A frequency-offset removal apparatus, comprising:

a receiving section for receiving a signal including a training sequence;

a local oscillator for generating an oscillating signal for synchronization with the signal received in the receiving section;

a frequency sweeping section for sweeping the frequency of the oscillating signal generated in the local oscillator through a specific frequency which is identical to the carrier frequency of the received signal;

a frequency shifting section for shifting the carrier frequency of the received signal by each oscillating signal generated in the local oscillator, each oscillating signal being swept in the frequency sweeping section;

a selecting section for selecting one specific frequency-shifted signal having a frequency nearest to the specific frequency-shifted signals generated in the frequency shifting section; and a frequency adjusting section for adjusting the frequency of the oscillating signal generated in the local oscillator to generate a specific oscillating signal which produces the specific frequency-shifted signal after being shifted by the received signal, the specific oscillating signal being shifted in the frequency shifting section by the received signal to produce a signal having a frequency-offset removed before outputting the signal to a demodulator, wherein the selecting section includes:

a matched filter for producing a matched signal having a value which is changed according to the value of the frequency offset of the frequency-shifted signal generated in the frequency shifting section which value will be greatest when the value of the frequency offset is zero, the matched signal being output for each oscillating signal;

an electric power calculator for calculating the electric power of each matched signal generated in the matched filter; and an electric power comparator and memory for comparing the electric power of each matched signal and storing the maximum value of the electric power and the frequency of the corresponding oscillating signal, the stored frequency being equivalent to the frequency nearest to the specific frequency.

8. A frequency-offset removal apparatus, comprising:

a receiving section for receiving a signal including a training sequence;

a local oscillator for generating an oscillating signal for synchronization with the signal received in the receiving section;

a frequency shifting section for shifting the carrier frequency of the received signal by a prescribed oscillating signal generated in the local oscillator;

a memory section for storing the frequency-shifted signal output from the frequency shifting section; a frequency-offset detecting section for detecting the value of the frequency offset of the frequency-shifted signal stored in the memory section; and a frequency-offset removal section for removing the frequency offset of the frequency-shifted signal stored in the memory section after receiving frequency-offset information of the frequency-shifted signal from the frequency-offset detecting section, wherein said frequency-offset detecting section includes:

a second local oscillator for generating an oscillating signal, the frequency of the oscillating signal being swept through a specific frequency;

a second frequency shifting section for re-shifting the frequency-shifted signal stored in the memory by each oscillating signal generated in the second local oscillator, the signal generated in the second frequency shifting section having no frequency offset when the signal is shifted by the specific frequency of the oscillating signal;

a matched filter for providing a matched signal the value of which is changed substantially proportional to the absolute value of the frequency offset of the frequency-shifted signal and will be greatest when the value of the frequency offset is zero, the matched signal being output for each oscillating signal;

an electric power calculator/selector for calculating the electric power of each matched signal generated in the matched filter and selecting the maximum electric power; and a control section for controlling the frequency of the oscillating signal generated in the second local oscillator and providing a specific oscillating frequency to the frequency-offset removal section, the specific oscillating frequency corresponding to the matched signal with the maximum electric power being selected in the selector.

9. A frequency-offset removal apparatus, comprising:

a receiving section for receiving a signal including a training sequence;

a local oscillator for generating an oscillating signal for synchronization with the signal received in the receiving section;

a frequency shifting section for shifting the carrier frequency of the received signal by a prescribed oscillating signal generated in the local oscillator;

a memory section for storing the frequency-shifted signal output from the frequency shifting section;

a frequency-offset detecting section for detecting the value of the frequency offset of the frequency-shifted signal stored in the memory section; and a frequency-offset removal section for removing the frequency offset of the frequency-shifted signal stored in the memory section after receiving frequency-offset information of the frequency-shifted signal from the frequency-offset detecting section, wherein said frequency-offset removal section includes:

a third local oscillator for generating the frequency of the specific oscillating signal output from the frequency-offset detecting section; and a third frequency shifter for shifting the frequency-shifted signal stored in the memory by the specific oscillating signal generated in the third local oscillator to produce a signal which has no frequency offset.

10. A frequency-offset removal apparatus, comprising:

a receiving section for receiving a signal including a training sequence;

a local oscillator for generating an oscillating signal for synchronization with the signal received in the receiving section;

a frequency shifting section for shifting the carrier frequency of the received signal by a prescribed oscillating signal generated in the local oscillator;

a shifter for re-shifting the frequency-shifted signal generated in the frequency-shifting section by an oscillating signal of which the frequency is automatically changed and generating a plurality of frequency-reshifted signals for each oscillating signal, the value of the frequency offset of one frequency-reshifted signal being different from the other by a prescribed frequency; and a selecting section for selecting a specific frequency-reshifted signal which has the smallest frequency-offset value of the frequency-reshifted signals generated in the shifter, the specific frequency-reshifted signal being output to a demodulator, wherein the selecting section includes:

a matched filter for producing a matched signal the value of which is changed according to the value of the frequency offset of the frequency-reshifted signal generated in the shifter and will have the greatest value when the amount of the frequency offset is zero, the matched signal being output for each oscillating signal;

an electric power calculator for calculating the electric power of each matched signal generated in the matched filter; and an electric power comparator and memory for comparing the electric power of each matched signal and storing the maximum value of the electric power and the frequency of the corresponding oscillating signal.

11. A frequency-offset removal apparatus, comprising:

a receiving section for receiving a signal including a training sequence;

a local oscillator for generating an oscillating signal for synchronization with the signal received in the receiving section;

a frequency shifting section for shifting the carrier frequency of the received signal by a prescribed oscillating signal generated in the local oscillator;

a memory section for storing the frequency-shifted signal provided from the frequency-shifting section;

a second local oscillator for generating a variable oscillating signal;

a frequency re-shifter for shifting the signal stored in the memory section and providing first and second signals in turn, the first signal being shifted in frequency by an amount equal to $+\Delta fd$ and the second signal being shifted in frequency by an amount equal to $-\Delta fd$;

a comparing/calculating section for calculating a difference between first and second matched filter output power signals, the first matched filter output power signal being obtained by feeding the first signal into a matched filter before calculating the output power and the second matched filter output power signal being obtained by feeding the second signal into the matched filter before calculating the output power; and a frequency adjusting section for adjusting the frequency of the oscillating signal generated in the second local oscillator according to the calculated difference obtained in the calculating section to produce a specific frequency re-shifted signal which has no frequency offset, the specific frequency re-shifted signal being output to a demodulator, wherein the comparing/calculating section includes:

a matched filter for providing first and second matched signals, respectively, the value of each matched signal being changed according to the value of the frequency offset of the first or second signal generated in the shifter and being greatest when the value of the frequency offset is zero;

an electric power calculator for calculating the electric power of each matched signal generated in the matched filter; and an electric power comparator for comparing the electric power values of the first and second matched signals calculated in the electric power calculator and calculating a difference in the electric power values, the difference of the electric power values being substantially proportional to the difference in the frequency offset between the first and second signals.

12. A frequency-offset removal apparatus, comprising:

a receiving section for receiving a signal formed in a prescribed pattern;

a local oscillator for generating an oscillating signal for synchronization with the signal received in the receiving section;

a frequency-shifting section for shifting the carrier frequency of the received signal by a prescribed oscillating signal generated in the local oscillator;

a memory section for storing the frequency-shifted signal provided from the frequency-shifting section, the frequency-shifted signal having a prescribed frequency offset equal to $\Delta fm$;

a shifter for shifting the frequency-shifted signal stored in the memory by a second oscillating signal generated in a second local oscillator to produce first and second signals simultaneously, the first signal having a frequency offset $\Delta fm + \Delta fd$ and the second signal having a frequency offset $\Delta fm - \Delta fd$;

a comparing/calculating section for comparing the value of the frequency offset of the first signal with that of the second signal and calculating a difference in the frequency offsets between the first and second signals; and a frequency adjusting section for adjusting the frequency of the oscillating signal generated in the local oscillator to produce a specific frequency-reshifted signal which has no frequency offset, the specific frequency-reshifted signal being output to a demodulator, wherein the comparing/calculating section includes:

a matched filter for outputting first and second matched signals, respectively, the value of each matched signal being changed according to the value of the frequency offset of the first or second signal generated in the shifter and being greatest when the value of the frequency offset is zero;

an electric power calculator for calculating the electric power of each matched signal generated in the matched filter; and an electric power comparator for comparing the electric power values of the first and second matched signals calculated in the electric power calculator and calculating a difference in the electric power values, the difference of the electric power values being substantially proportional to the difference in the frequency offset between the first and second signals.

13. A frequency-offset removal apparatus, comprising:

a receiving section for receiving a signal formed in a prescribed pattern;

a local oscillator for generating an oscillating signal for synchronization with the signal received in the receiving section;

a frequency-shifting section for shifting the carrier frequency of the received signal by a prescribed oscillating signal generated in the local oscillator;

a pair of shifters for re-shifting the frequency-shifted signal generated in the frequency-shifting section to produce first and second signals, respectively, the first signal having a frequency offset $\Delta fm + \Delta fd$ and the second signal having a frequency offset $\Delta fm - \Delta fd$;

a comparing/calculating section for calculating a difference between first and second matched filter output power, the first matched filter output power being obtained by feeding the first signal into a matched filter before calculating the output power and the second matched filter output power being obtained by feeding the second signal into the matched filter before calculating the output power; and a frequency adjusting section for adjusting the frequency of the oscillating signal generated in the local oscillator to produce a specific frequency re-shifted signal which has no frequency offset, the specific frequency re-shifted signal being output to a demodulator, wherein the comparing/calculating section includes:

a pair of matched filters for providing first and second matched signals, respectively, each matched signal containing a main impulse and subsequent smaller impulses wherein the value of the signal is changed according to the amount of the frequency offset of the first or second signals generated in each shifter wherein said value will be greatest when the amount of the frequency offset is zero;

a pair of electric power calculators for calculating the electric power of each matched signal generated in the matched filter;

an electric power subtractor for calculating the difference in the electric power values of the matched signals, the difference of the electric power values being substantially proportional to a frequency offset $\Delta fm$; and a control section for outputting a difference in the electric power values of the matched signals calculated in the substractor of the frequency adjusting section when the difference in the electric power between the main impulses is calculated in the subtractor.

* * * * *